(12) United States Patent
Hsu

(10) Patent No.: US 12,317,566 B2
(45) Date of Patent: May 27, 2025

(54) ISOLATED FIN STRUCTURES IN SEMICONDUCTOR DEVICES

(71) Applicant: Taiwan Semiconductor Manufacturing Company, Ltd., Hsinchu (TW)

(72) Inventor: Yu-Rung Hsu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 511 days.

(21) Appl. No.: 17/468,483

(22) Filed: Sep. 7, 2021

(65) Prior Publication Data

US 2022/0285531 A1   Sep. 8, 2022

Related U.S. Application Data

(60) Provisional application No. 63/157,214, filed on Mar. 5, 2021.

(51) Int. Cl.
| | | |
|---|---|---|
| *H10D 30/67* | (2025.01) | |
| *H10D 30/00* | (2025.01) | |
| *H10D 30/01* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |

(52) U.S. Cl.
CPC ......... *H10D 64/018* (2025.01); *H10D 30/031* (2025.01); *H10D 30/502* (2025.01); *H10D 30/6758* (2025.01); *H10D 62/116* (2025.01); *H10D 64/015* (2025.01); *H10D 64/017* (2025.01); *H10D 84/0158* (2025.01); *H10D 84/038* (2025.01); *H10D 84/834* (2025.01); *H10D 30/6735* (2025.01); *H10D 30/6757* (2025.01); *H10D 62/118* (2025.01)

(58) Field of Classification Search
None
See application file for complete search history.

(56) References Cited

U.S. PATENT DOCUMENTS

| | | | |
|---|---|---|---|
| 8,759,874 B1 | 6/2014 | Loubet et al. | |
| 8,956,942 B2 * | 2/2015 | Loubet | H01L 27/0886 438/164 |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |

(Continued)

*Primary Examiner* — Nicholas J Tobergte
*Assistant Examiner* — William Henry Anderson
(74) *Attorney, Agent, or Firm* — Sterne, Kessler, Goldstein & Fox P.L.L.C.

(57) ABSTRACT

A semiconductor device and a method of forming the same are disclosed. The method includes forming a fin with a sacrificial layer on a semiconductor substrate, forming isolation regions on the semiconductor substrate and adjacent to the fin, forming a superlattice structure with first and second nanostructured layers on the sacrificial layer, forming a sacrificial structure that surrounds the superlattice structure, forming a first spacer on the superlattice structure, forming an air gap between the superlattice structure and the fin, and forming a second spacer on the fin and below the superlattice structure.

20 Claims, 23 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 * | 3/2017 | Ching .................. H01L 21/283 |
| 10,170,638 B1 * | 1/2019 | Reznicek ............. H10D 62/021 |
| 2020/0052107 A1 * | 2/2020 | Lie ..................... H10D 84/0151 |
| 2020/0105869 A1 * | 4/2020 | Loubet ................ H01L 29/7851 |
| 2021/0320210 A1 * | 10/2021 | Lin ..................... H10D 64/018 |
| 2021/0376095 A1 * | 12/2021 | Chen ............... H01L 21/823475 |

* cited by examiner

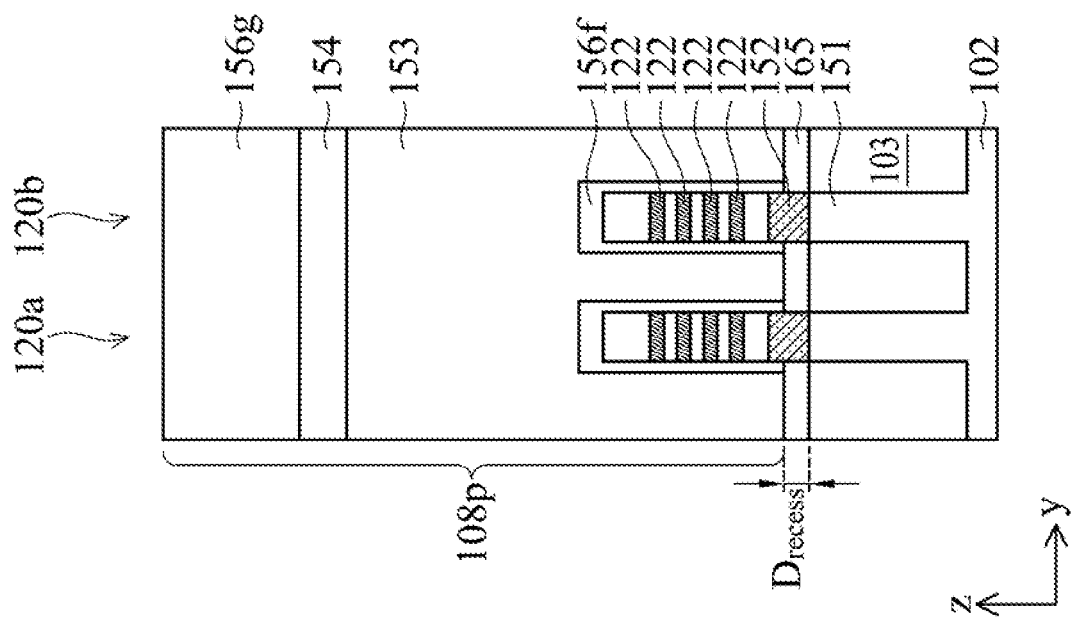
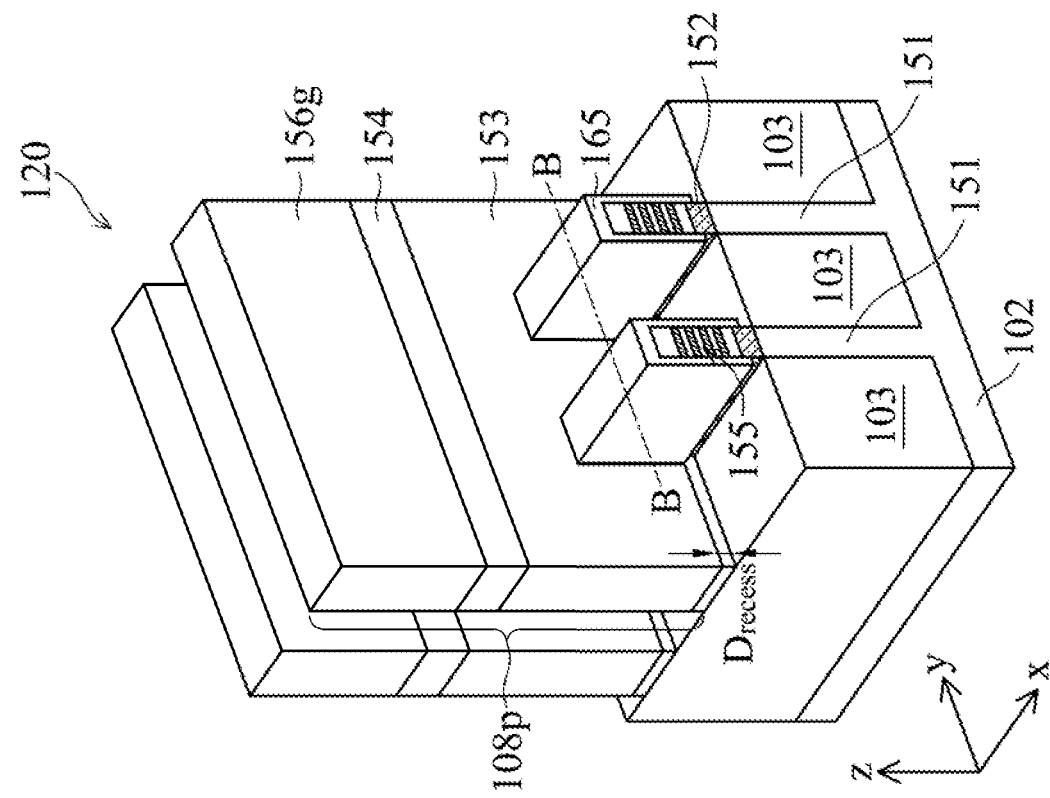
FIG. 8B
FIG. 8A

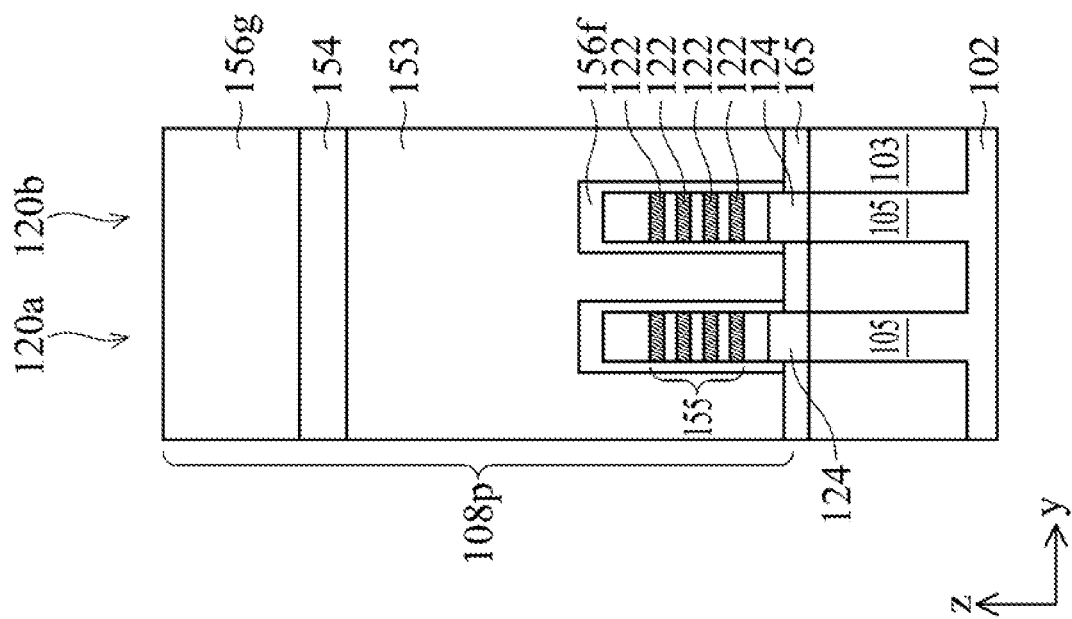
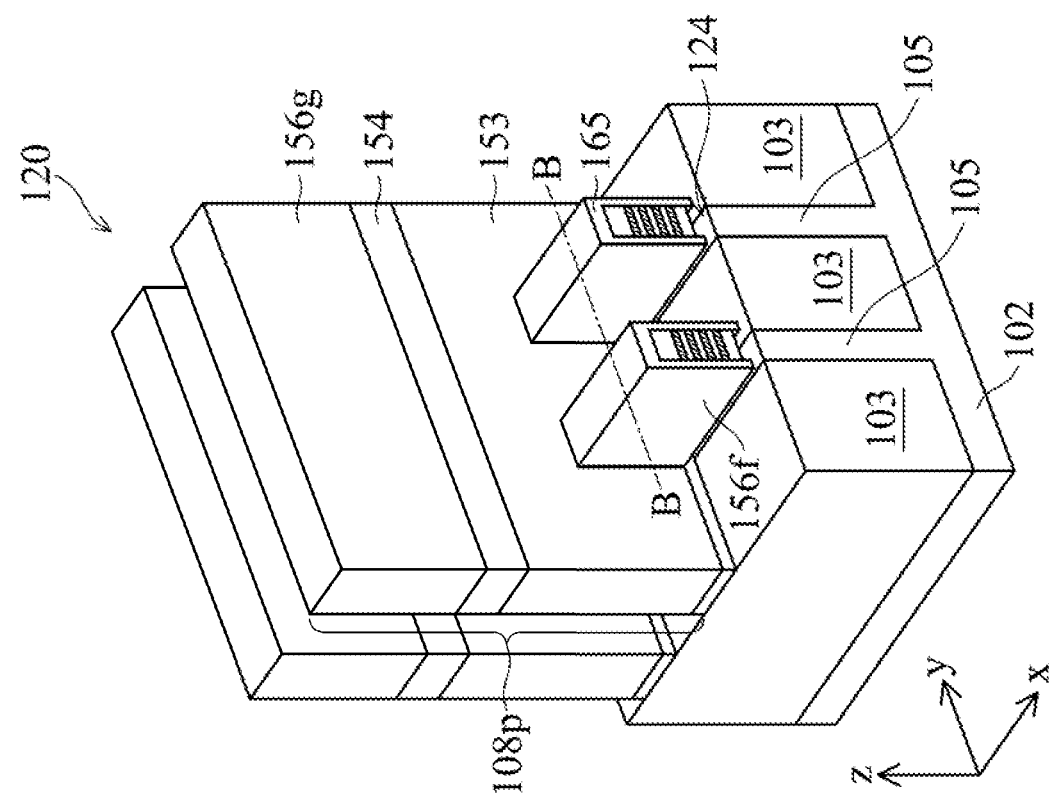
FIG. 9B
FIG. 9A

ISOLATED FIN STRUCTURES IN SEMICONDUCTOR DEVICES

CROSS-REFERENCE TO RELATED APPLICATION

This patent application claims benefit of U.S. Provisional Patent Application No. 63/157,214 filed on Mar. 5, 2021 and titled "FinFET Having a Self-aligned Air Gap," which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs), and nano-sheet FETs. Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. Dimensions of the various features may be arbitrarily increased or reduced for clarity of discussion. In the figures, identical reference numerals identify similar features or elements.

FIGS. 7A-15A illustrate isometric views of semiconductor devices at various stages of their fabrication process, in accordance with some embodiments.

FIGS. 7B-17B, 12C-15C, 13D, 16, and 17A, illustrate cross-sectional views of semiconductor devices at various stages of their fabrication process, in accordance with some embodiments.

DETAILED DESCRIPTION

Figure 1:
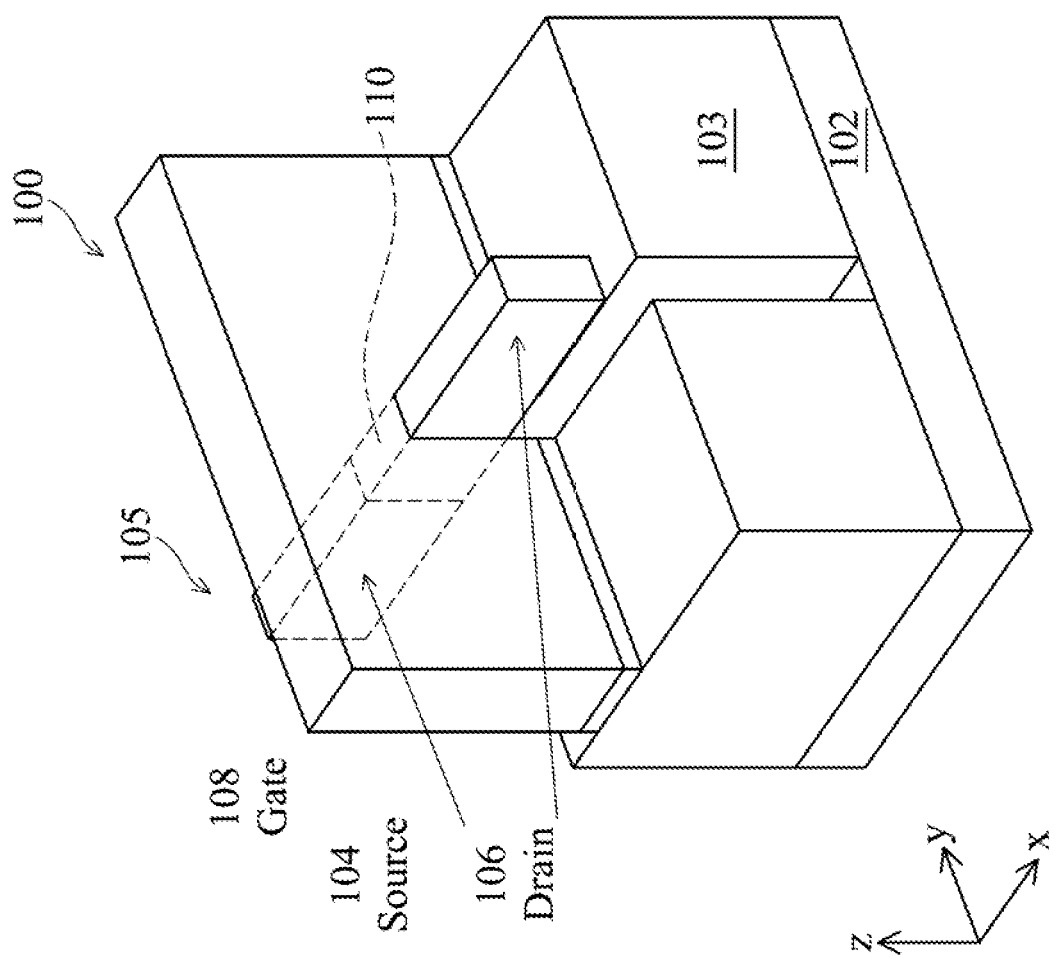
FIG. 1 illustrates an isometric view of a FinFET.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

FIG. 1 shows basic elements of a FinFET 100 in three dimensions, with transparency. FinFET 100 includes a substrate 102, shallow trench isolation (STI) regions 103, a fin 105, source/drain (S/D) regions 104 and 106 respectively, a gate structure 108, and a channel 110. FinFET 100 is formed on substrate 102. STI regions 103 are formed in substrate 102 to electrically isolate FinFET 100 from neighboring FinFETs. Fin 105 extends outward from the top surface of substrate 102 in the Z-direction. During operation of FinFET 100, current flows from source region 104 to drain region 106, through channel 110, in response to a voltage applied to gate 108. S/D regions 104 and 106 are typically doped with either a positive or a negative species to provide charge reservoirs for FinFET 100. Gate structure 108 surrounds three sides of fin 105 to control the current flow through channel 110. Gate structure 108 is a multi-layered structure that includes (not shown) a gate electrode, a gate dielectric that separates the gate from fin 105, and sidewall spacers, as described in greater detail below. One FinFET is shown in FIG. 1. However, gate structure 108 may wrap around multiple fins arranged along the Y-axis to form a FinFET array. Likewise, separated regions of a single fin 105 may be controlled by multiple gates arranged along the X-axis, to form a FinFET array.

When the voltage applied to the gate electrode exceeds a certain threshold voltage, FinFET 100 switches on and current flows through channel 110. If the applied voltage drops below the threshold voltage, FinFET 100 shuts off, and current ceases to flow through channel 110. Because the wrap-around gate structure 108 influences channel 110 from three sides, improved control of the conduction properties of channel 110 is achieved in a FinFET, compared with previous planar FETs. Such improved control reduces leakage of charge from channel 110 to substrate 102, or from S/D regions 104 and 106 to substrate 102. Because the current-carrying capacity of channel 110 is much greater than that of a planar conducting channel, switching characteristics of the FinFET are also improved over those of planar FETs. However, reducing current leakage in the on-state and the off-state of FinFET 100, and during switching, remains a challenge for FinFET designers.

A FinFET in which channel 110 takes the form of a multi-channel stack is known as a gate-all-around (GAA) FET. In a GAAFET, the multiple channels within the stack are surrounded on all four sides by the gate to further improve control of current flow in the channels. GAAFETs having 1-D, linear, channels are known as nano-wire FETs; GAAFETs having 2-D, planar channels are known as nano-sheet FETs. Embodiments of the present disclosure are shown and described, by way of example, as nano-sheet FETs having certain advantageous features. However, such features described herein may be applied to other types of FETs such as, for example, single-channel FinFETs, or other types of FETs having nano-structured channel regions such as stacked channel nano-wire FETs.

Figure 2B:
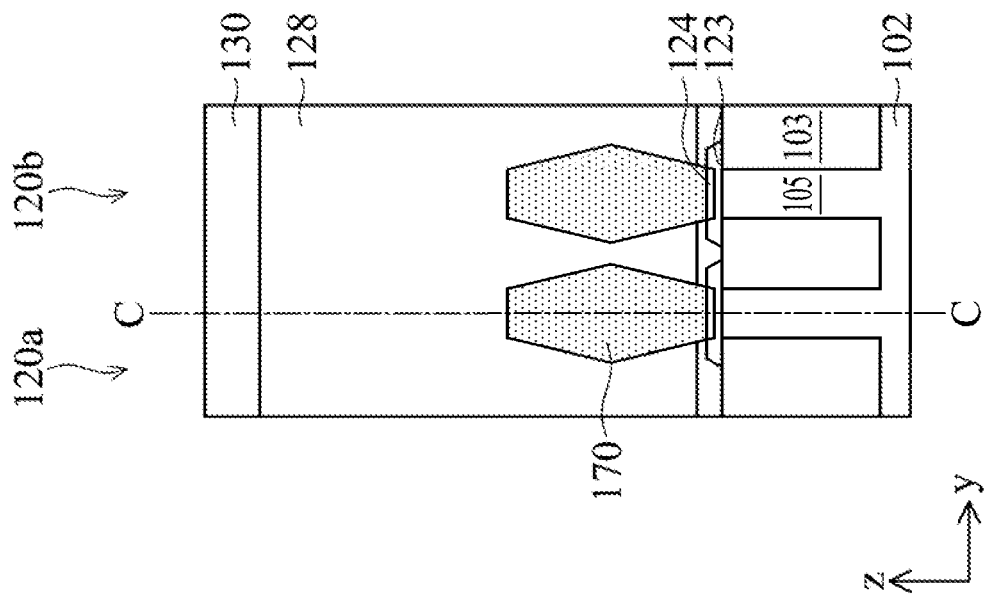
FIGS. 2B and 2C illustrate cross-sectional views of the semiconductor device shown in FIG. 2A, in accordance with some embodiments.
Figure 2A:
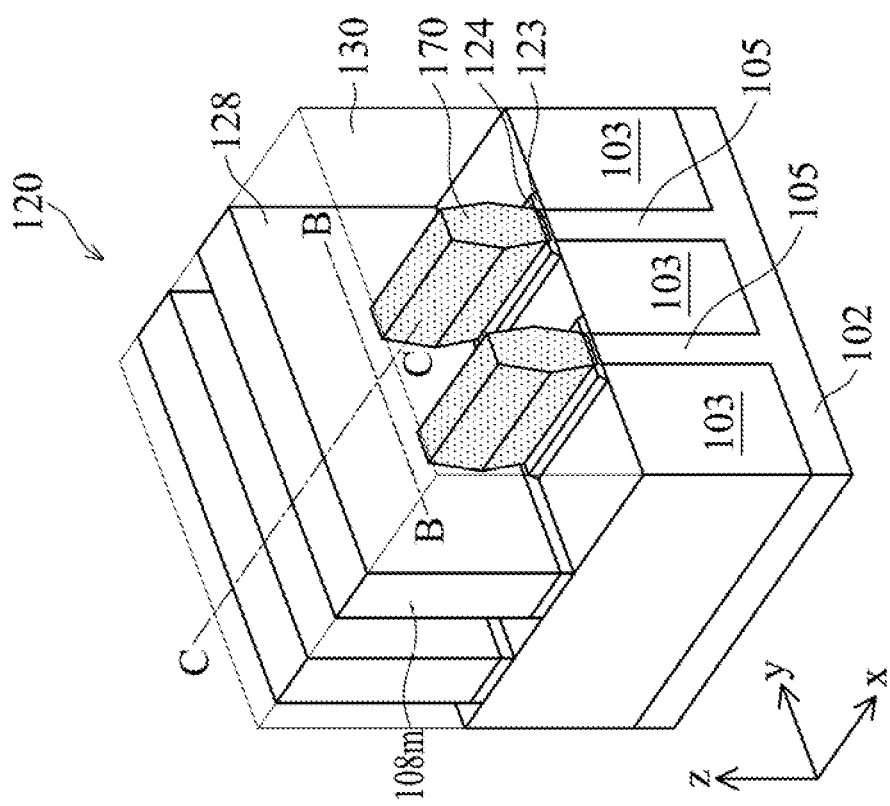
FIG. 2A illustrate an isometric view of a semiconductor device, in accordance with some embodiments.
Figure 2C:
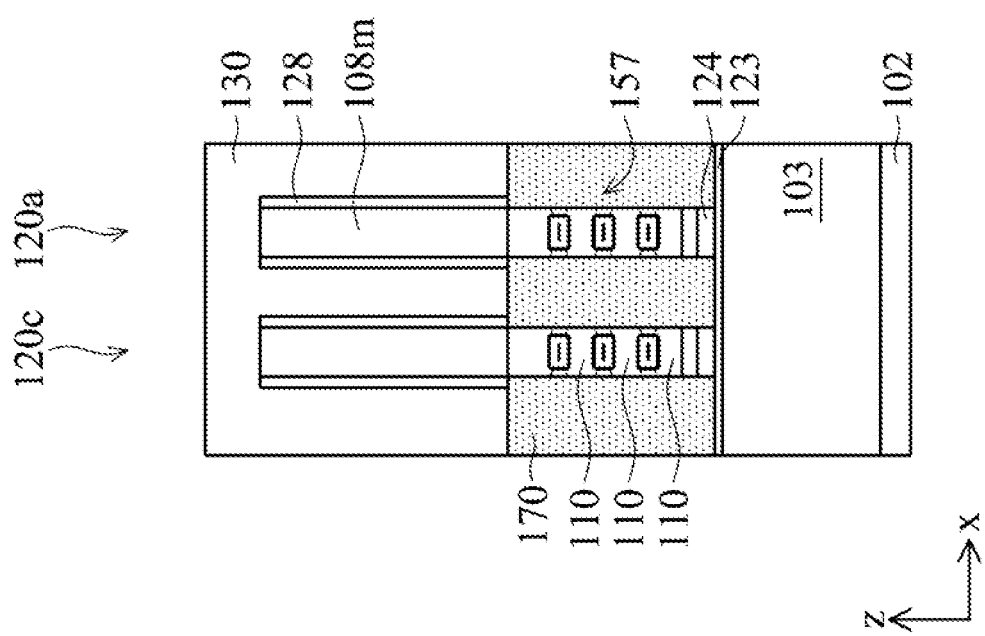

A semiconductor device 120 that includes GAAFETs 120a, 120b, and 120c is described herein with reference to FIGS. 2A-2C, according to some embodiments. FIG. 2A illustrates an isometric view of semiconductor device 120. FIG. 2B illustrates a cross-sectional view of two adjacent GAAFETs 120a-120b along cut line B-B across epitaxial source/drain (S/D) regions 170, as shown in FIG. 2A. FIG. 2C illustrates a cross-sectional view of two adjacent GAAFETs 120a and 120c along cut line C-C across gate structures 108c and 108a, as shown in FIG. 2A.

Semiconductor device 120 is formed on substrate 102 and includes STI regions 103, fins 105, and fin top spacers 123. STI regions 103 provide electrical isolation between neighboring FETs and from neighboring active and passive elements (not illustrated herein) integrated with or deposited onto substrate 102. STI regions 103 can include a dielectric material. GAAFETs 120a, 120b, and 120c each include epitaxial S/D regions 170, and metal gate structures 108m having gate spacers 128. Gate structures 108m can be formed by a replacement metal gate, or "gate last" process. Underneath metal gates 108m, GAAFETs 120a, 120b, and 120c include GAA channel regions 157 and nanostructured channels 110. GAAFETs 120a, 120b, and 120c are substrate-isolated from fins 151 by air gaps 124, as described herein. In some embodiments, GAAFETs 120a, 120b, 120c lack sidewall spacers (e.g., sidewall spacers 132 shown in FIG. 3A-3B) that may constrain lateral growth of epitaxial S/D regions 170, as described below. Semiconductor device 120 further includes ILD layer 130, through which electrical contacts can be made to source, drain, and gate terminals of GAAFETs 120a, 120b, and 120c.

Figure 3B:
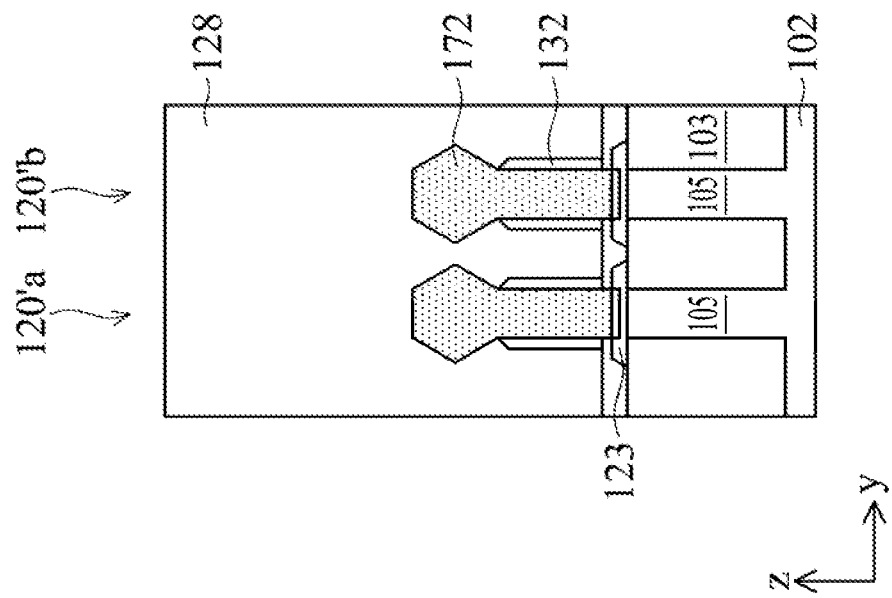
FIGS. 3B and 3C illustrate cross-sectional views of the semiconductor device shown in FIG. 3A, in accordance with some embodiments.
Figure 3A:
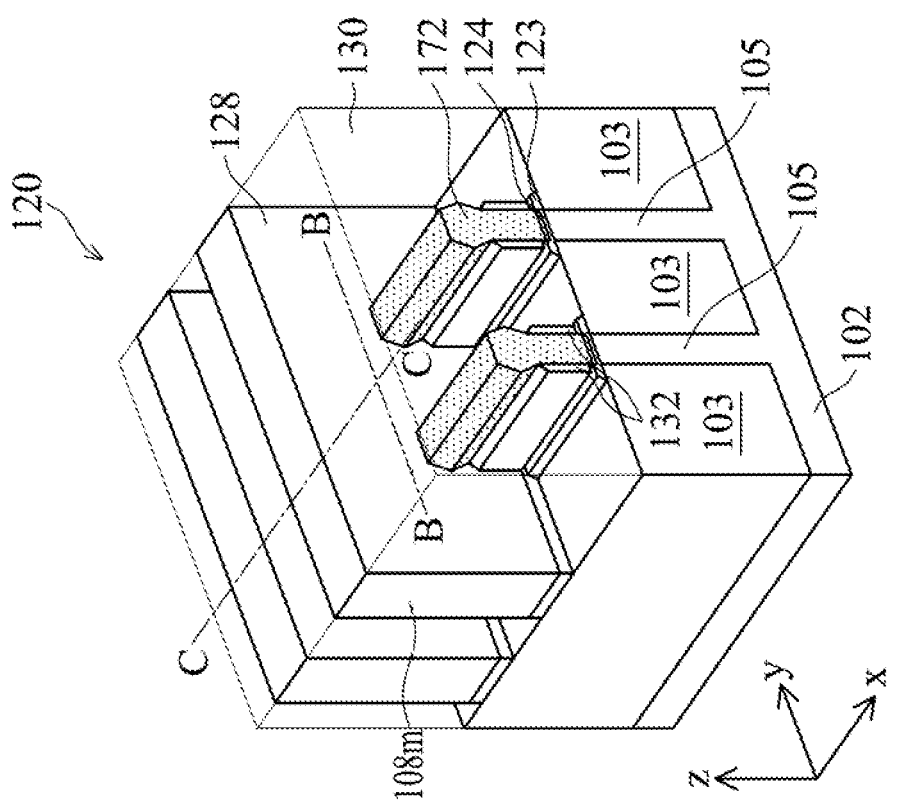
FIG. 3A illustrates an isometric view of a semiconductor device, in accordance with some embodiments.
Figure 3C:
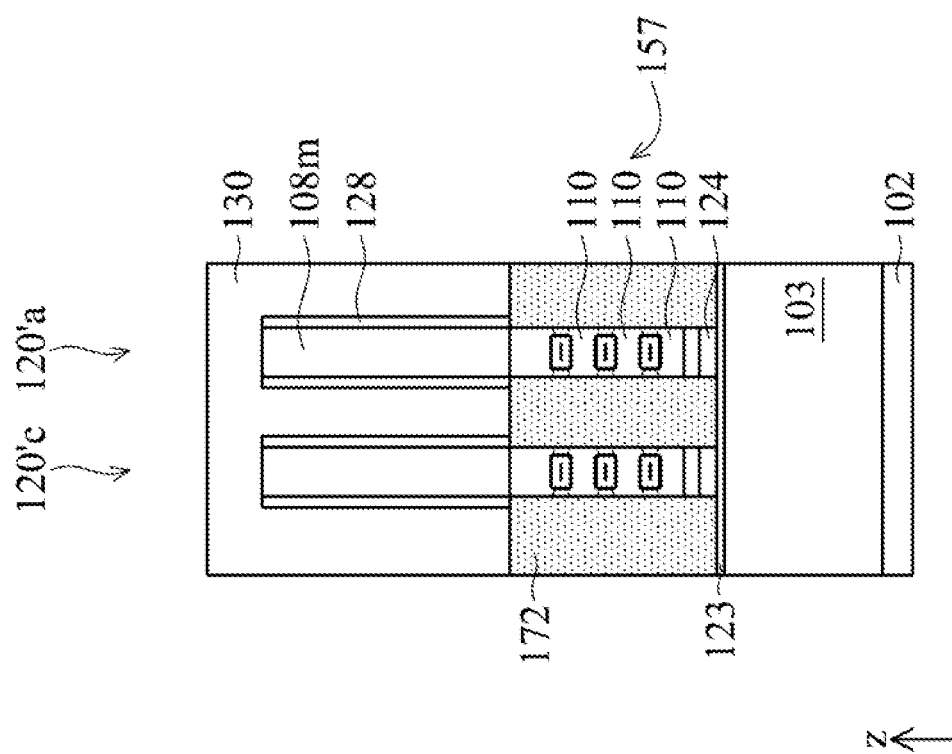

A semiconductor device 120' that includes GAAFETs 120'a, 120'b, and 120'c is described herein with reference to FIGS. 3A-3C, according to some embodiments. FIG. 3A illustrates an isometric view of semiconductor device 120'. FIG. 3B illustrates a cross-sectional view of two adjacent GAAFETs 120'a, 120'b along cut line B-B across fins 105, as shown in FIG. 3A. FIG. 3C illustrates a cross-sectional view of two adjacent GAAFETs 120'a, 120'c along cut line C-C across gate structures 108a, 108c, as shown in FIG. 3A.

Semiconductor device 120' is formed on substrate 102 and includes STI regions 103, fins 105, and fin top spacers 123. GAAFETs 120'a, 120'b, and 120'c each include epitaxial S/13 regions 172 and metal gate structures 108m having gate spacers 128. Like semiconductor device 120, semiconductor device 120' can include gate structures 108m formed by a replacement metal gate, or "gate last" process. Underneath metal gates 108m, GAAFETs 120'a, 120'b, and 120'c include GAA channel regions 157 and nanostructured channels 110. GAAFETs 120'a, 120'b, and 120'c are substrate-isolated from fins 105 by air gaps 124, as described herein. In some embodiments, GAAFETs 120a', 120b', 120c' have sidewall spacers 132 that influence the shape of epitaxial S/D regions 172, as described below. Semiconductor device 120' further includes ILD layer 130, through which electrical contacts can be made to source, drain, and gate terminals of GAAFETs 120'a, 120'b, and 120'c.

In some of the figures, semiconductor devices 120, 120' are shown as including a plurality of FETs, having multiple fins and/or multiple gates. Semiconductor devices 120, 120' as shown herein can therefore represent either a single GAAFET or an array of GAAFETs. Semiconductor devices 120, 120' can include one or more FinFETs, one or more nano-sheet FETs, one or more nano-wire FETs, or one or more of other types of FETs. Semiconductor devices 120, 120' can include multiple STI regions 103, multiple gate structures 108, multiple fins 105, and multiple stacks of nanostructured channels 110.

Referring to FIGS. 2A-2C and 3A-3C, epitaxial S/D regions 170 and 172 disposed over fins 105 of devices 120, 120' include an epitaxially grown semiconductor material. In some embodiments, the epitaxially grown semiconductor material can be the same material as the material of substrate 102. In some embodiments, the epitaxially grown semiconductor material can include a different material from the material of substrate 102. The epitaxially grown semiconductor material can include, for example: (i) a semiconductor material, such as germanium (Ge) or silicon (Si); (ii) a compound semiconductor material, such as gallium arsenide (GaAs) or aluminum gallium arsenide (AlGaAs); or (iii) a semiconductor alloy, such as silicon germanium (SiGe) or gallium arsenic phosphide (GaAsP). In some embodiments of a multi-FinFET array, fins 105 can be made of the same or different semiconductor materials. Epitaxial S/D regions 170 and 172 can be formed via an epitaxial growth process, as described in further detail below. Doping type of epitaxial S/D regions 170 and 172 can also be determined by introducing one or more precursors during the epitaxial growth process.

Referring to FIGS. 2C and 3C, semiconductor devices 120, 120' further include one or more metal gate structures 108m. In some embodiments, metal gate structures 108m surround respective nanostructured channels 110, in which case devices 120, 120' are referred to as "gate-all-around (GAA) structures" or "horizontal gate-all-around (HGAA) structures. Stacked nanostructured channels 110 can include layers of semiconducting materials. For example, stacked nanostructured channels 110 can include layers of silicon or silicon germanium (SiGe). Additionally or alternatively, stacked nanostructured channels 110 can include one or more alloy semiconductors, such as silicon germanium carbide (SiGeC), gallium arsenic phosphide (GaAsP), gallium indium phosphide (GaInP), gallium indium arsenide (GaInAs), gallium indium arsenic phosphide (GaInAsP), aluminum indium arsenide (AlInAs), and aluminum gallium arsenide (AlGaAs).

Although FIGS. 2C and 3C show two metal gate structures 108m, any number of metal gate structures 108m can be included in devices 120, 120', in which each of metal gate structures 108m can be parallel to one another and can traverse any number of fins similar to fins 105. In some embodiments, metal gate structure 108m can surround a portion of a top surface and a portion of side surfaces of a single GAA channel region 157. In some embodiments, metal gate structure 108m can surround a portion of a top surface, a portion of side surfaces, and a portion of a bottom surface of a GAA channel region 157. Gate structure 108m can include a gate electrode and a dielectric layer disposed between the gate electrode and a nanostructured channel 110. In some embodiments, metal gate structure 108m can have a horizontal dimension (e.g., gate length) $L_g$ that ranges from about 5 nm to about 30 nm. In some embodiments, metal gate structure 108m can be formed by a gate replacement process, in which a temporary gate is formed initially, and is later replaced, following formation of the rest of the GAAFET structure.

Figure 4B:
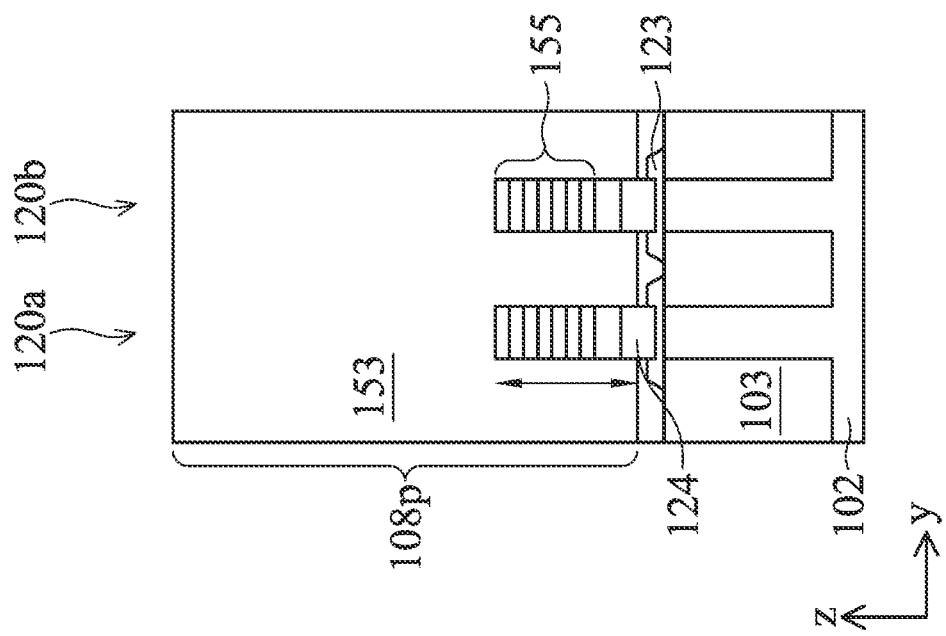
FIGS. 4B and 4C illustrate cross-sectional views of the semiconductor device shown in FIG. 4A, in accordance with some embodiments.
Figure 4A:
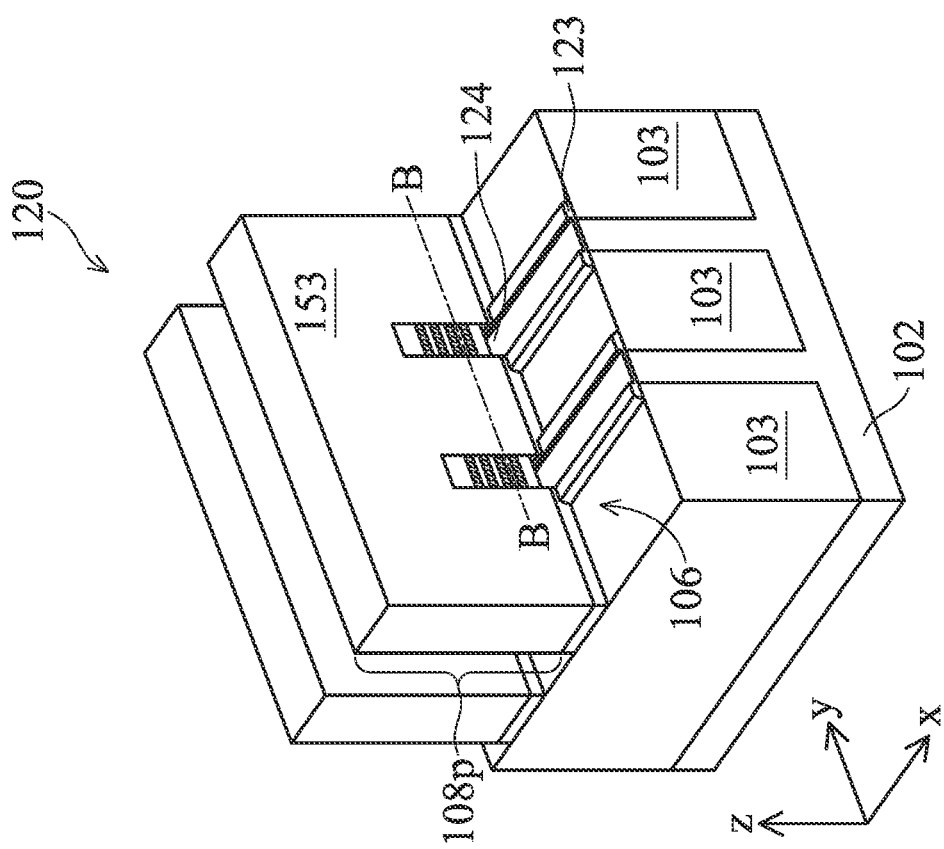
FIG. 4A illustrates an isometric view of a semiconductor device, in accordance with some embodiments.
Figure 4C:
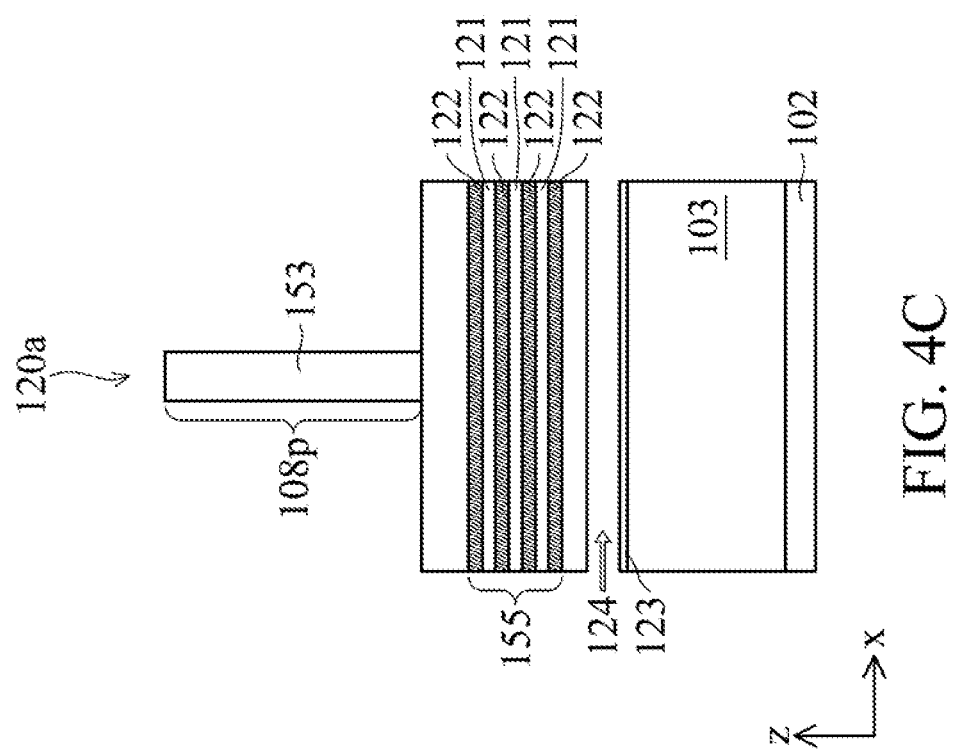

FIGS. 4A, 4B, and 4C show semiconductor device 120 at an intermediate step of fabrication, according to some embodiments. In particular, FIGS. 4A-4C show semiconductor device 120 when inner elements are exposed such as, for example, the alternating nanostructured layers 121-122 that form stacked nanostructured channels 110 by removing nanostructured layers 122 in subsequent processing. At such an intermediate step, the cross-sectional views shown in FIGS. 4B and 4C show the stack of nanostructured layers 121-122 isolated from fins 105, and consequently isolated from substrate 102 by an air gap 124 and a fin top spacer 123, which features are partially obscured by other structural elements in the views shown in FIGS. 2A-2C and FIGS. 3A-3C.

Air gaps 124 prevent current leakage between a) epitaxial S/D regions 170, 172 and fins 105 that are integral with substrate 102, and b) superlattice structures 155 and substrate 102. During operation of the FETs, air gaps 124 ensure that substantially no current flows in the nanostructured channels 110 when the FETs are switched off, and that maximal current flows in the nanostructured channels 110 when the FETs are switched on. Leakage current reduction further improves drain current uniformity (IDU), and, being more efficient, may permit operation of FETs 120, 120' using a lower applied voltage. Furthermore, with air gap 124 and fin top spacers 123 formed underneath epitaxial S/D regions 170, 172, heights of the epitaxial S/D regions can be made substantially equal, as will be explained in further detail below. In the present implementation, structures that are suspended over air gaps 124 remain structurally stable throughout the process disclosed herein, in part because such structures are clamped in place by sacrificial gate structure 108p.

Figure 5:
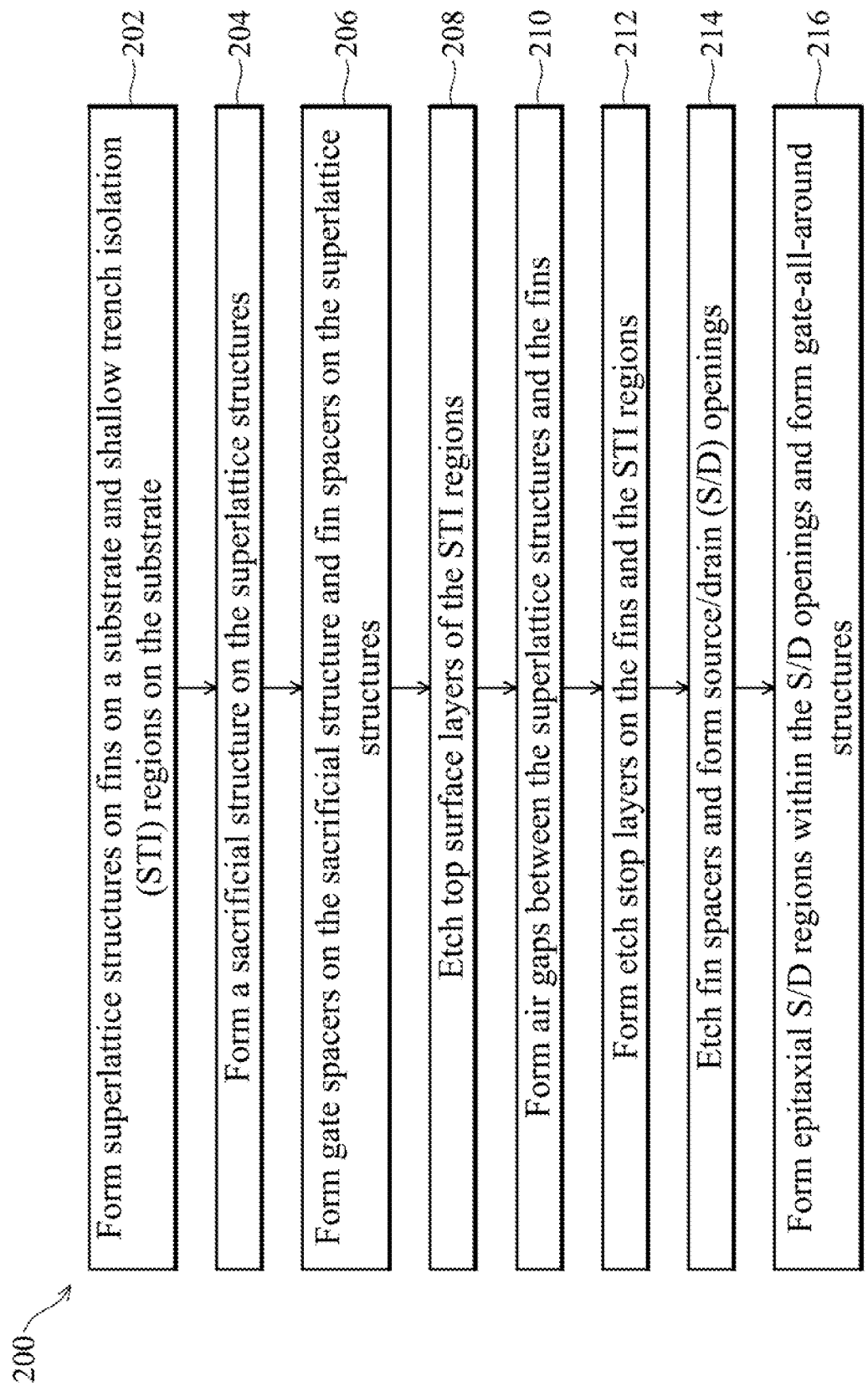
FIG. 5 is a flow diagram of a method for fabricating the semiconductor devices shown in FIGS. 2A-2C and 3A-3C, in accordance with some embodiments.

FIG. 5 is a flow diagram of an example method 200 for fabricating semiconductor devices 120, 120', according to some embodiments. For illustrative purposes, operations illustrated in FIG. 5 will be described with reference to the exemplary process for fabricating semiconductor devices 120, 120' as illustrated in FIGS. 6A-6C, 7A-15A, 7B-15B, 12C-15C, 16, and 13D, which are isometric or cross-sectional views of semiconductor devices 120, 120' at various stages of their fabrication, according to some embodiments. Operations can be performed in a different order, or not performed, depending on specific applications. It is noted that method 200 may not produce complete semiconductor devices 120, 120'. Accordingly, it is understood that additional processes can be provided before, during, or after method 200, and that some of these additional processes may only be briefly described herein.

Method 200 includes operations for fabricating substrate-isolated GAAFET devices 120a-120c that prevent channel-to-substrate leakage and source/drain-to-substrate leakage.

Figure 6C:
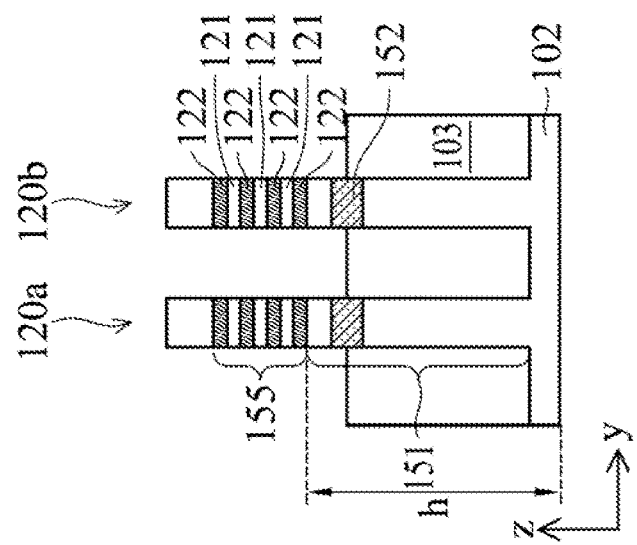
FIGS. 6A-6C illustrate cross-sectional views for forming superlattice structures of a semiconductor device, in accordance with some embodiments.
Figure 6B:
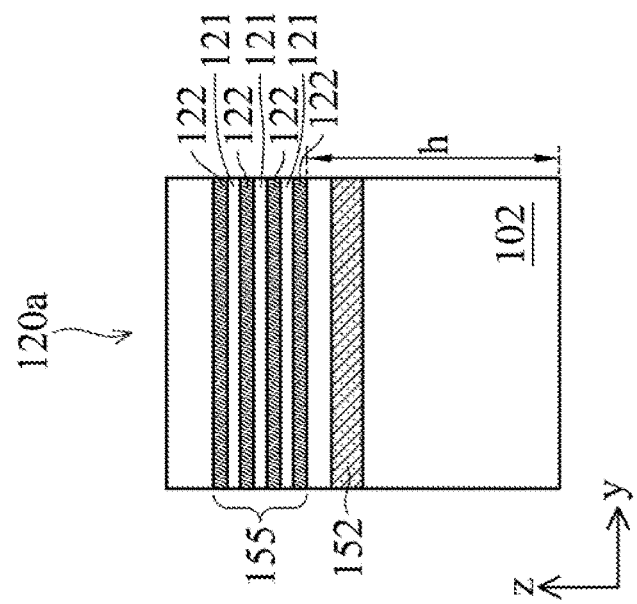
Figure 6A:
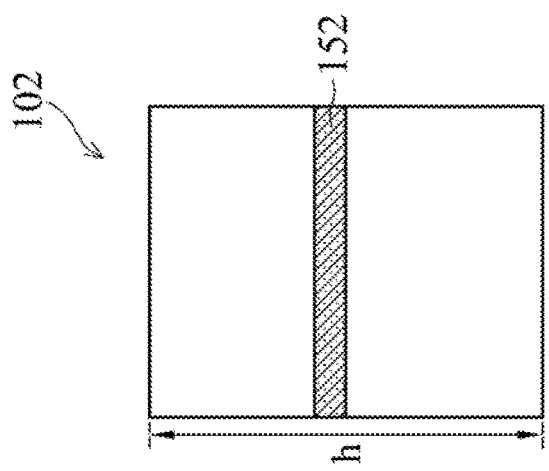

In operation 202, superlattice structures are formed on fins on a substrate. For example, as shown FIGS. 6A-6C, superlattice structures 155 are formed on fins 151 on substrate 102. FIG. 6A illustrates a cross-sectional view of semiconductor substrate 102 prior to forming superlattice structures 155. FIG. 6B illustrates a cross-sectional view of substrate 102 after formation of superlattice structures 155. FIG. 6C illustrates a cross-sectional view of after the formation of superlattice structures 155, fins 151, and STI regions 103.

Referring to FIG. 6A, substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic. In some embodiments, substrate 102 can include a crystalline substrate, where a top surface substrate 102 can be parallel to (100), (110), (111), c-plane (0001) crystal plane.

In some embodiments, substrate 102 includes a buried layer 152, for example, a buried SiGe layer. In some embodiments, a layer of SiGe may be deposited or grown on substrate 102, followed by the formation of a silicon layer above the SiGe layer. In some embodiments, SiGe buried layer 152 has a composition that includes a germanium content of about 30% to about 60%. In some embodiments, SiGe buried layer 152 has a composition that includes a germanium content of about 20%. SiGe buried layer 152 may have a thickness in the range of about 1-30 nm. Substrate 102 has a total height h.

Bulk silicon substrates 102 as shown in FIG. 6A are generally less expensive than silicon-on-insulator (SOI) substrates often used in the semiconductor industry. However, source-drain leakage may be higher and there may be greater fin height variation when using a bulk silicon substrate. The structures and methods described herein may facilitate use of a bulk silicon substrate by avoiding such liabilities, thereby effectively improving performance of the lower cost substrate.

Referring to FIGS. 6B and 6C, superlattice structures 155 can include a stack of nanostructured layers 121 and 122 arranged in an alternating configuration. In some embodiments, nanostructured layers 121 include materials similar to one another, e.g., epitaxial Si, and nanostructured layers 122 include materials similar to one another, e.g., epitaxial SiGe. In some embodiments, superlattice structures 155 are formed by etching a stack of two different semiconductor layers (not shown) arranged in the alternating configuration. Nanostructured layers 122 are replaced in subsequent processing, while nanostructured layers 121 remain as part of semiconductor devices 120, 120'. Although FIGS. 6B-6C show three nanostructured layers 121 and four nanostructured layers 122, any number of nanostructured layers can be included in each superlattice structure 155. The alternating configuration of superlattice structure 155 can be achieved by alternating deposition, or epitaxial growth, of SiGe and Si layers, starting from the top silicon layer of substrate 102. Si layers can form nanostructured layers 121, which are interleaved with SiGe nanostructured layers 122. Each of the nanostructured layers 121-122 may have thicknesses in the range of about 1-5 nm. In some embodiments, the topmost nanostructured layers (e.g., Si layers) of superlattice structures 155 may be thicker than the underlying nanostructured layers.

The stack of two different semiconductor layers can be formed via an epitaxial growth process. The epitaxial growth process can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or another suitable CVD process; (ii) molecular beam epitaxy (MBE) processes (iii) another suitable epitaxial process; or (iv) a combination thereof. In some embodiments, source-drain regions can be grown by an epitaxial deposition/partial etch process, which repeats the epitaxial deposition/partial etch process at least once. Such repeated deposition/partial etch process is also called a "cyclic deposition-etch (CDE) process." In some embodiments, source-drain regions can be grown by selective epitaxial growth (SEG), where an etching gas can be added to promote selective growth on exposed semiconductor surfaces of substrate 102 or fin 105, but not on insulating material (e.g., dielectric material of STI regions 103).

Doping type of the stack of two different semiconductor layers can also be determined by introducing one or more precursors during the above-noted epitaxial growth process. For example, the stack of two different semiconductor layers can be in-situ p-type doped during the epitaxial growth process using p-type doping precursors, such as diborane (B2H6) and boron trifluoride (BF3). In some embodiments, the stack of two different semiconductor layers can be in-situ n-type doped during an epitaxial growth process using n-type doping precursors, such as phosphine (PH3) and arsine (AsH3).

Following the formation of superlattice structures 155, etching of the silicon substrate 102 can continue, to form fins 151, as shown in FIGS. 6B-6C. Fins 151 include the three layers of substrate 102 shown in FIG. 6A, e.g., Si/SiGe/Si. Fins 151 provide structural support for superlattice structures 155.

The trenches around fins 151 are then filled with an insulating material to form STI regions 103, as shown in FIG. 6C. For example, STI 103 can be deposited and then etched back to a height that coincides with the SiGe buried layer 152. Insulating material in STI region 103 can include, for example, silicon oxide e.g.,($SiO_2$), silicon nitride (SiN), silicon oxynitride (SiON), fluoride-doped silicate glass (FSG), or a low-k dielectric material, and/or other suitable insulating material. In some embodiments, STI regions 103 can include a multi-layered structure. In some embodiments, the process of depositing the insulating material can include any deposition method suitable for flowable dielectric materials (e.g., flowable silicon oxide). For example, flowable silicon oxide can be deposited for STI regions 103 using a flowable CVD (FCVD) process. The FCVD process can be followed by a wet anneal process. In some embodiments, the process of depositing the insulating material can include depositing a low-k dielectric material to form a liner. In some embodiments, a liner made of another suitable insulating material, can be placed between STI region 103 and adjacent FETs.

In some embodiments, STI 103 may be annealed. Annealing the insulating material of STI regions 103 can include annealing the deposited insulating material in a steam environment at a temperature in a range from about 200° C. to about 700° C. for a time period in a range from about 30 min to about 120 min. The anneal process can be followed by a polishing process that can remove a surface layer of the insulating material. The polishing process can be followed by the etching process to recess the polished insulating material to form STI regions 103. The recessing of the polished insulating material can be performed, for example, by a dry etch process, a wet etch process, or a combination thereof. In some embodiments, the dry etch process for recessing the polished insulating material can include using a plasma dry etch with a gas mixture that can include octafluorocyclobutane (C4F8), argon (Ar), oxygen (O2), helium (He), fluoroform (CHF3), carbon tetrafluoride (CF4), difluoromethane (CH2F2), chlorine (Cl2), hydrogen bromide (HBr), or a combination thereof with a pressure ranging from about 1 mTorr to about 5 mTorr. In some embodiments, the wet etch process for recessing the polished insulating material can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process for recessing the polished insulating material can include using an etch process that uses ammonia (NH3) and hydrofluoric acid (HF) as etchants and inert gases, such as Ar, xenon (Xe), He, or a combination thereof. In some embodiments, the flow rate of HF and NH3 used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a temperature ranging from about 50° C. to about 120° C.

Figure 7B:
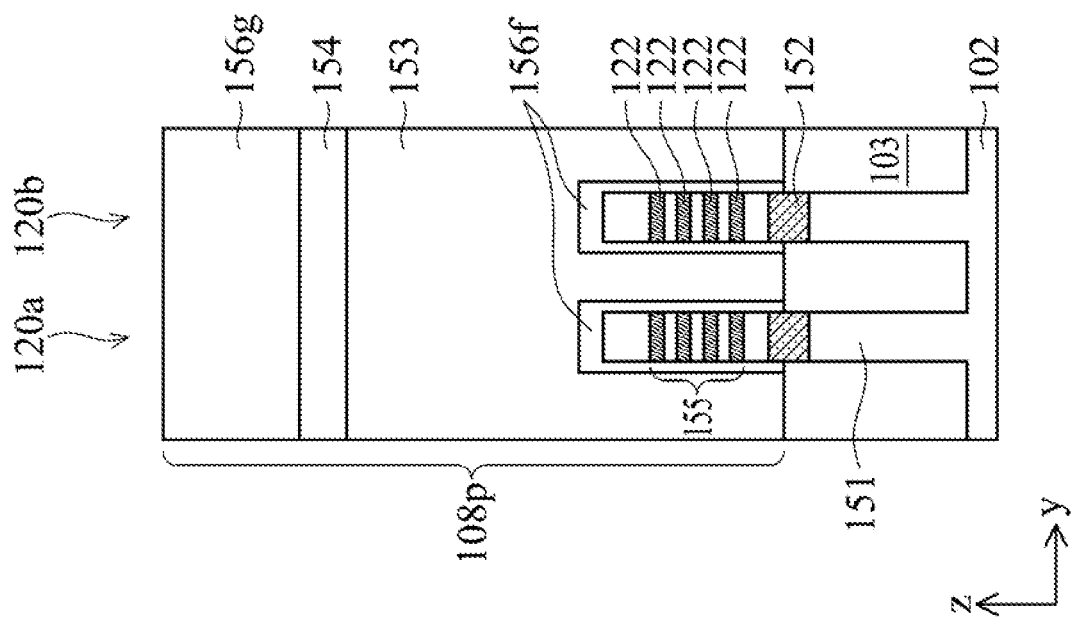
Figure 7A:
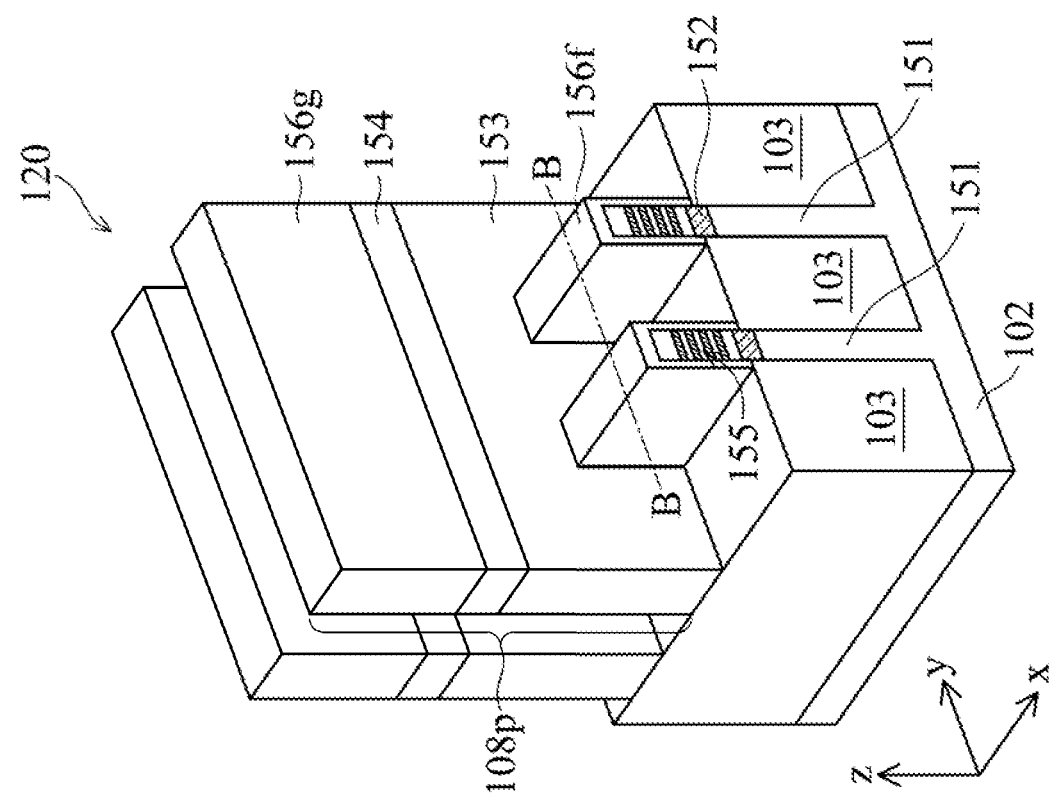

Referring to FIG. 5, in operation 204 a sacrificial structure is formed on the superlattice structures. For example, as shown in FIGS. 7A-7B, a sacrificial structure 108$p$ is formed around superlattice structures 155. Sacrificial structure 108$p$ includes: a polysilicon layer 153 and hard mask layers 154 and 156$g$ on polysilicon layer 153. Polysilicon layer 153 is deposited and then patterned using hard mask layers 154 and 156$g$. Hard mask layer 154 may be an oxide material that can be grown and/or deposited using an ALD process. Hard mask layer 156$g$ can be a SiN material that can be grown and/or deposited on hard mask 154, using an ALD process. Polysilicon layer 153 and hard mask layers 154 and 156$g$ are later replaced, at operation 216, by a metal gate.

Referring to FIG. 5, in operation 206, gate spacers on the sacrificial structure and fin spacers on the superlattice structure are formed. For example, as shown in FIGS. 7A-7B, fin spacers 156$f$ are formed over superlattice structures 155, according to some embodiments. Gate spacers 128 (not shown in FIGS. 7A-7B; shown in FIGS. 2A-3C) on the sidewalls of polysilicon layer 153 are formed at the same time as fin spacers 156$f$. The process of forming gate spacers 128 and fin spacers 156$f$ can include conformally depositing a spacer material layer (not shown) to cover hard mask layers 154 and 156$g$, sidewalls of polysilicon layer 153, superlattice structures 155, and STI regions 103. Gate spacers 128 and fin spacers 156$f$ are formed from different portions of the spacer material layer.

The process of forming gate spacers 128 and fin spacers 156$f$ can further include a surface treatment prior to the deposition of the spacer material layer. In some embodiments, the surface treatment can include exposing sacrificial structure 108$p$, superlattice structures 155, and STI regions 103 to an inhibitor to form H- or F-terminated surfaces on the exposed surfaces of sacrificial structure 108$p$, superlattice structures 155, and STI regions 103. The H- or F-terminated surfaces can facilitate the deposition of the spacer material layer. The spacer material layer can be deposited using, for example, CVD or ALD. The surface treatment can be performed before or during the deposition process. The deposition process can be followed by, for example, an oxygen plasma treatment to remove a hydrophobic component on the spacer material layer.

In some embodiments, the spacer material layer can include (i) a dielectric material, such as silicon oxide, silicon carbide, silicon nitride, and silicon oxy-nitride, (ii) an oxide material, (iii) a nitride material, (iv) a low-k material, or (v) a combination thereof. The process of forming gate spacers 128 and fin spacers 156$f$ can further include patterning processes (e.g., lithography and etching processes) to remove portions of the spacer material layer from the surfaces of hard mask layers 154 and 156$g$ and STI regions 103. In some embodiments, the etching process can be an anisotropic etch that removes the spacer material layer faster on horizontal surfaces (e.g., on the X-Y plane) compared to vertical surfaces (e.g., on the Y-Z or X-Z planes). In some embodiments, the spacer material layer can have a thickness in a range from about 1 nm to about 8 nm.

Referring to FIG. 5, in operation 208, top surface layers of STI regions are etched. For example, as shown in FIGS. 8A-8B, top surface layers of STI regions 103 are etched to expose sacrificial SiGe buried layer 152 under superlattice structures 155, according to some embodiments. In some embodiments, top surface layers of STI regions 103 are etched (referred to as "STI etch-back process") using a timed etch to remove a prescribed amount of STI regions 103. In some embodiments, the top surface layers of STI 103 may be a separate insulating material that is different from the insulating material that makes up the rest of STI regions 103, and therefore allows for selective removal of the top surface layers. The top surface layers may have a thickness in the range of about 1 nm to about 20 nm. Selective removal can be achieved using a wet chemical etching process, or using an end-pointed plasma etching process that detects a change in composition of etch products at the interface of the two insulating materials. In some embodiments, the etch-back of the top surface layers may remove up to 20% more, or 20% less material, such that the critical dimension is in the range of about 8 nm to about 12 nm.

The STI etch-back process has higher selectivity for the top surface layers than gate spacers 128 and fin spacers 156$f$. The STI etch-back process is directional, or anisotropic in the downward vertical (-Z) direction so as to remove the top surface layers of STI regions 103 without substantially undercutting polysilicon layer 153. Limiting the amount of lateral etching will avoid collapse of sacrificial structure 108$p$ or superlattice structures 155. There may be some amount of lateral etching to expose sacrificial SiGe layer 152, but not enough lateral etching to punch through STI regions 103 below polysilicon layer 153. About 2 to about 8 nm of lateral etching can remove portions of fin spacers 156$f$ and expose SiGe layer 152. Several etch chemistries for the lateral etching may be used, for example, plasma etching with a fluorine-based plasma, (e.g., $C_xF_y$, or BCl3); wet chemical etching using hydrofluoric acid (e.g., $NH_3/HF$); or a gaseous chemical etchant such as, for example, $NF_3/H_2$.

The STI etch-back process exposes a lower sidewall area 165 of STI regions 103 underlying polysilicon layer 153 that is not protected by gate spacers 128. The depth of the STI etch-back, $D_{reccess}$, can be in the range of about 1.5 nm to about 25 nm, defining the exposed sidewall area 165. The STI etch-back process also removes spacer material from lower sidewalls of superlattice structures 155, thus exposing buried SiGe layer 152 at the base of superlattice structures 155 where fin spacers 156$f$ contacts STI regions 103. The amount of buried SiGe layer 152 that is exposed at the base of superlattice structures 155 therefore depends on the depth of the STI etch-back, which may be within the range of about 1.5 nm to about 25 nm.

Referring to FIG. 5, in operation 210, air gaps are formed between the superlattice structures and the fins. For example, as shown in FIGS. 9A-9B, air gaps 124 are formed between superlattice structures 155 and fins 105. The formation of air gaps 124 includes selectively removing, from fins 151, the SiGe buried layer 152 exposed at operation 208. As a result, fins 105 are formed and air gaps 124 are formed under the superlattice structures 155. Air gaps 124 electrically isolate fins 105 from the suspended superlattice structures 155. The portions of suspended superlattice structures 155 that are not covered by sacrificial structure 108$p$ are replaced with epitaxial S/D regions 170 or 172 (shown in FIGS. 2A-3C) in subsequent processing. As a result, air gaps 124 electrically isolate epitaxial S/D regions 170 or 172 from fins 105 and consequently prevent current leakage between epitaxial S/D regions 170 or 172 and fins 105, which are integral to substrate 102. Also, air gaps 124 electrically isolate nanostructured channels 110 within superlattice structures 155 from fins 105 and consequently prevent current leakage between nanostructured channels 110 and fins 105, which are integral to substrate 102. Heights of air gaps 124 are substantially the same as the thickness of the removed SiGe buried layer 152. In some embodiments, air gaps 124 can have heights h of about 10 Å to about 300 Å. The width of air gaps 124 is substantially equal to the gate length $L_g$, which is between about 50 Å to about 300 Å. The aspect ratio (i.e., ratio of height h to width w) of air gaps 124 can range from about 0.2:1 to about 1:1. These dimension ranges of air gaps can adequately prevent current leakage between nanostructured channels 110 and fins 105. If the height of the air gap is too small, there could be a risk of structural collapse that would allow for current leakage. Alternatively, if the air gap is very narrow and the current is at the high end of its range, arcing may possibly occur between the channel 110 and the fin 105.

Selective removal of the SiGe buried layer 152 can be referred to as a "fin isolation etch" process. In some embodiments, the exposed portions of SiGe buried layer 152 may be selectively removed by a chemical etching process using a gas chemistry, or sequence of gas flows, including $NF_3$ and $H_2$ or $NF_3$ and $F_2$. In some embodiments, the exposed portions of SiGe buried layer 152 can be selectively removed by a plasma etching process using a gas chemistry, or sequence of gas flows, including a halogen-based gas and $C_4F_8$. The etching process used to remove the exposed portions of SiGe buried layer 152 can also remove a small amount of material from the surface of fin 105, depending on the SiGe:Si selectivity of the etching process. The fin isolation etch process minimizes lateral oxide recess underneath sacrificial structure 108p, to avoid collapse of sacrificial structure 108p.

Figure 10B:
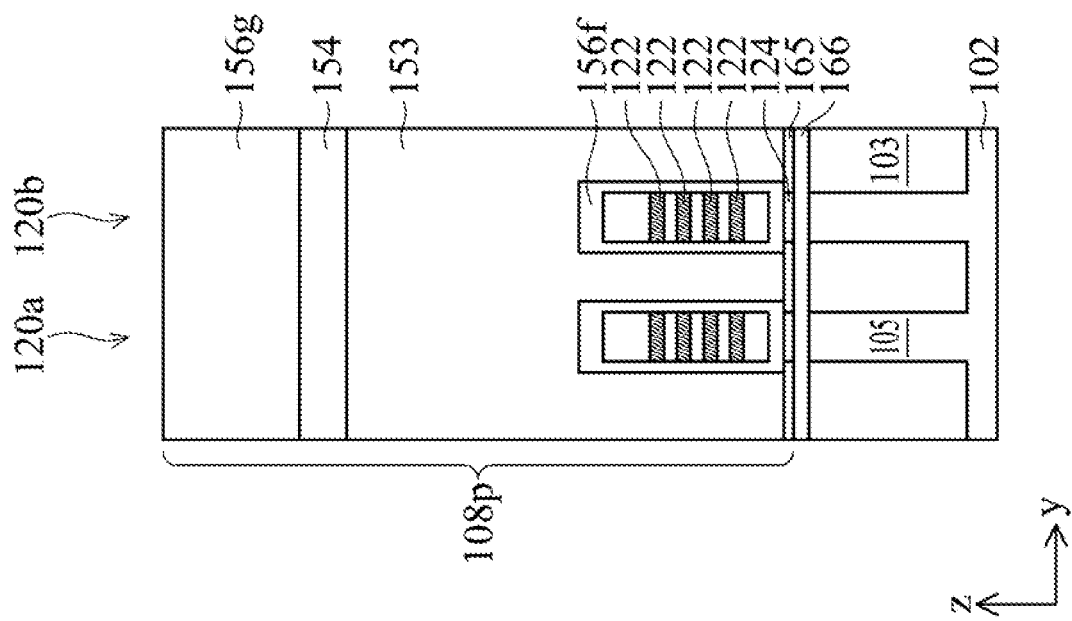
Figure 10A:
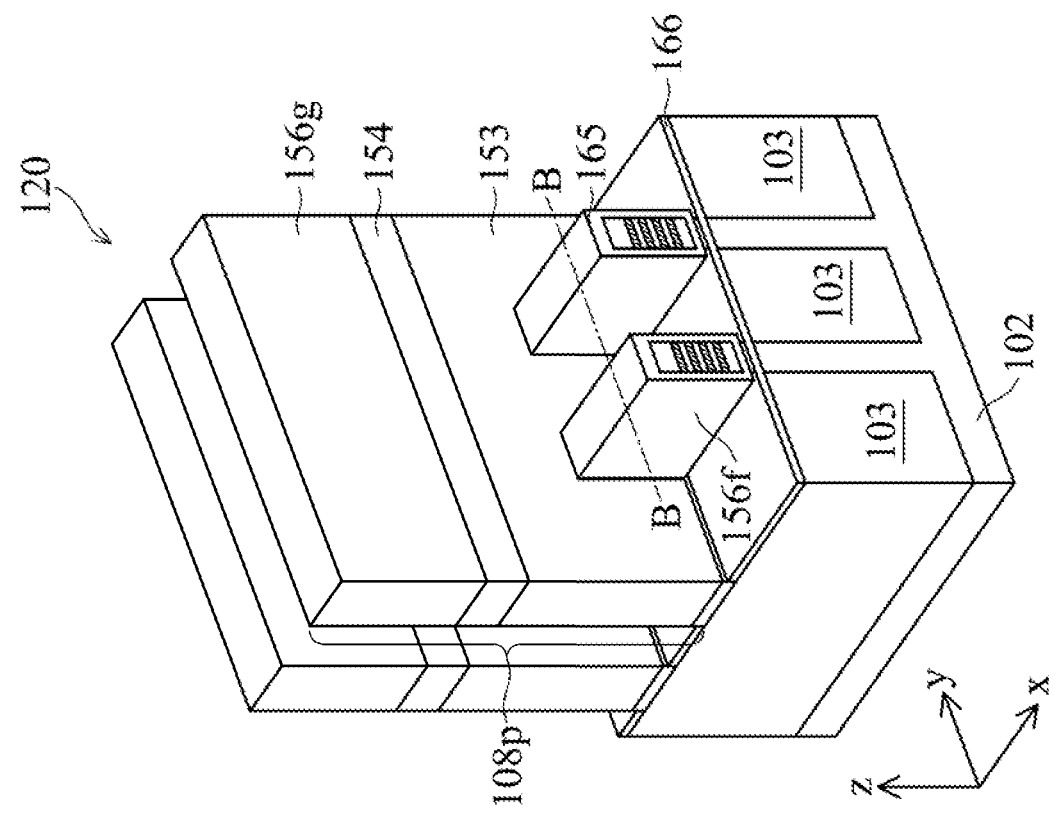

Referring to FIG. 5, in operation 212, etch stop layers are formed on the fins and the STI regions. For example, as shown in FIGS. 10A-10B, etch stop layers 166 are formed on top surfaces of fins 105, and substantially simultaneously on bottom surfaces of superlattice structures 155 that are facing top surfaces of fins 105. The formation of etch stop layers 166 can include using an atomic layer deposition (ALD) process. The thickness of etch stop layers 166 range from about 1 nm to about 20 nm so that etch stop layers 166 approximately matches the STI recess depth and fills at least portions of air gaps 124. In some embodiments, the remaining portions of air gaps can range from about 4 nm to about 6 nm. If deposition of etch stop layers 166 on the bottom surfaces of superlattice structures 155 causes etch stop layers 166 to contact lower corners of fin spacers 156f, etch stop layers 166 are referred to as "merged etch stop layers." Merged etch stop layers 166 can have a thickness of about 2 nm to about 25 nm. If etch stop layers 166 do not contact lower corners of fin spacers 156f, etch stop layers 166 are "not merged." In some embodiments, deposition of etch stop layers 166 covers exposed sidewall areas 165 at the lower sidewall surfaces of polysilicon layer 153 and also increases the top thickness of fin spacers 156f. In some embodiments, etch stop layers 166 include a dielectric film, such as SiN, SiOCN, and the like.

Figure 11B:
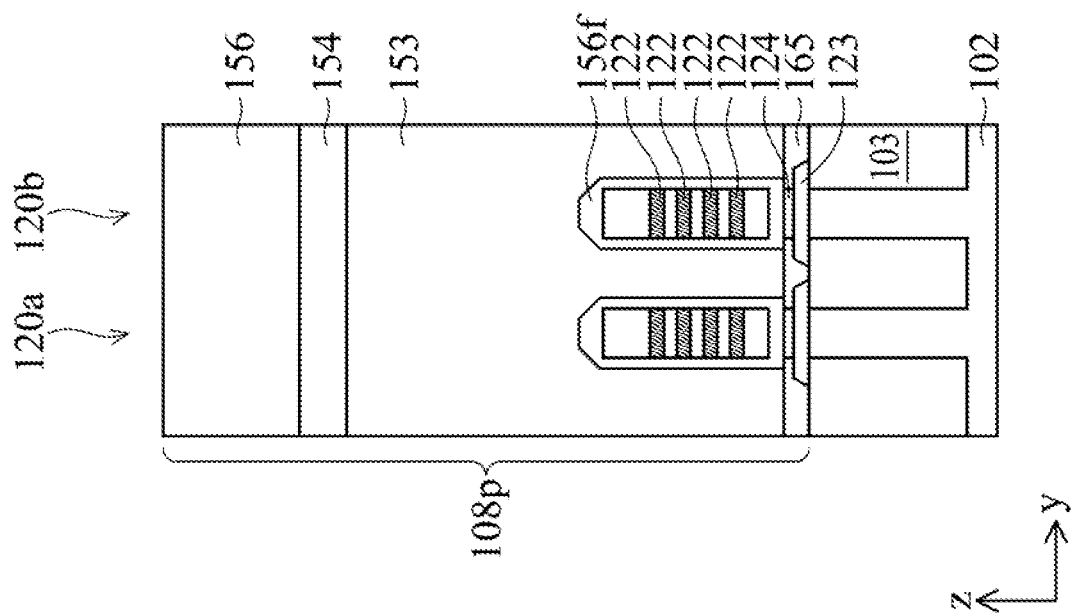
Figure 11A:
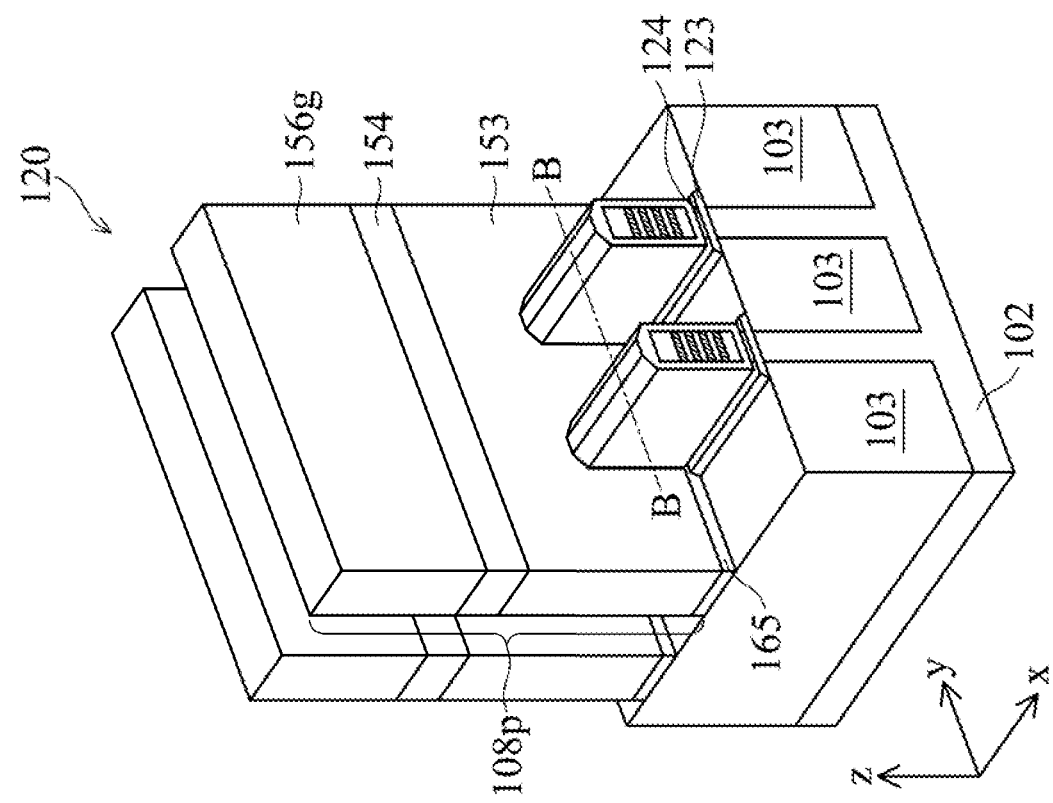

Referring to FIGS. 11A and 11B, in operation 212, following the formation of etch stop layers 166, thickened top surfaces of fin spacers 156f are recessed, according to some embodiments. Recessing fin spacers 156f can form rounded sidewall profiles. At the same time, etch stop layers 166 are patterned using superlattice structures as masks to form self-aligned fin top spacers 123. In some embodiments, the resulting fin top spacers 123 can have sloped sidewall profiles, as shown in FIGS. 11A-11B.

Figure 12B:
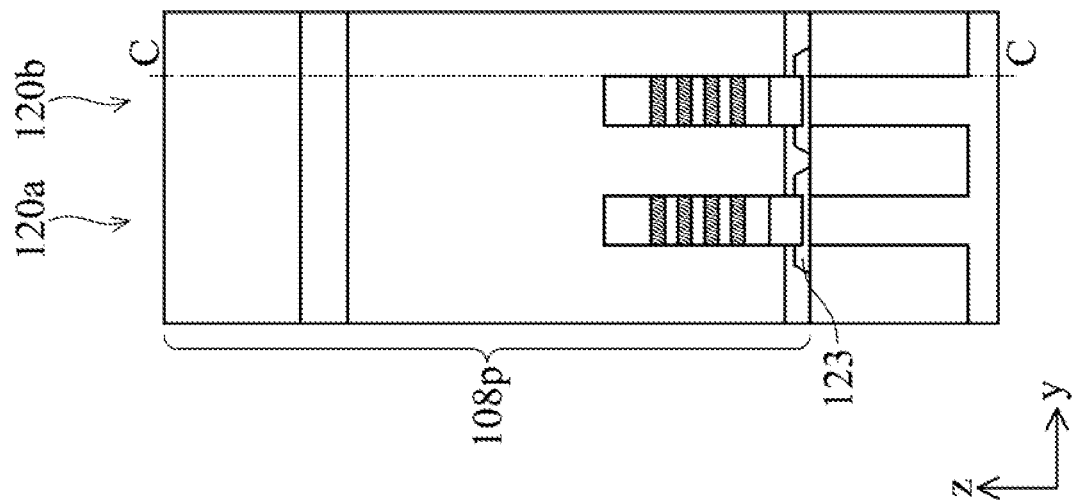
Figure 12A:
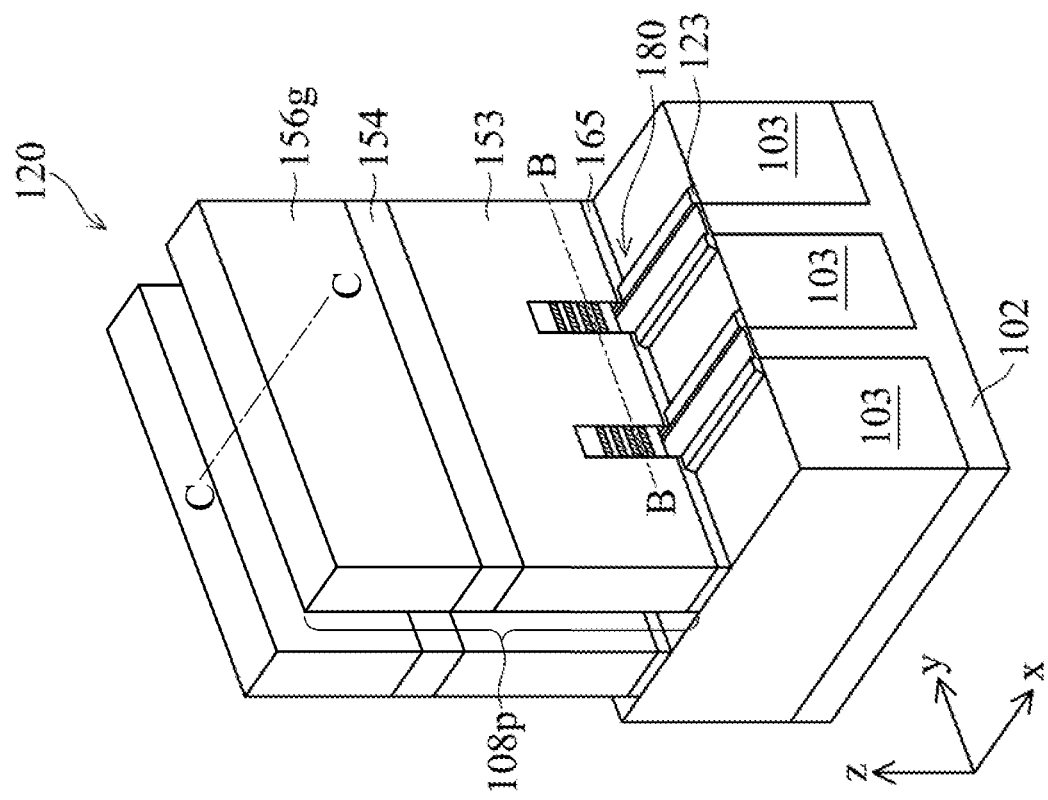
Figure 12C:
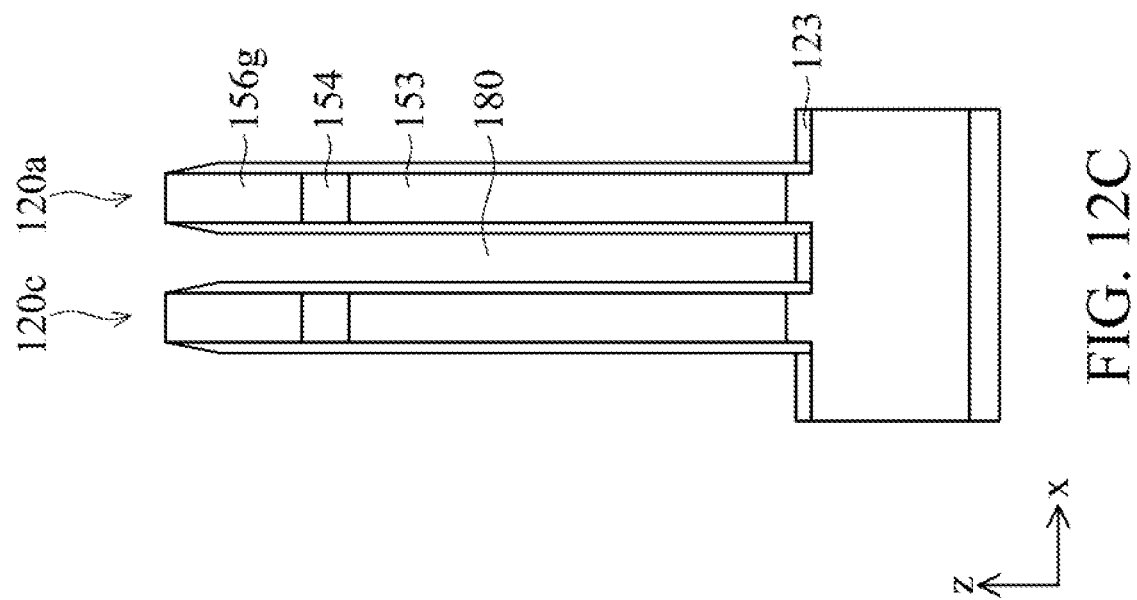

Referring to FIG. 5, in operation 214, fin spacers are etched and SID openings 180 are formed. For example, as shown in FIGS. 12A-12C, fin spacers 156f are etched from the top surfaces of superlattice structures 155, and the suspended portions of superlattice structures 155 are etched to form S/D openings 180 on fin top spacers 123, according to a first embodiment. A first etching step etches top portions of fin spacers 156f. Then, in a second etching step, according to some embodiments, remaining portions of fin spacers 156f are etched. Following the removal of fin spacers 156f, superlattice structures 155 can be recessed in the S/D region using an anisotropic etch process that has lower selectivity for the materials of hard mask 156g and STI regions 103. FIG. 12A is an isometric view of GAAFET 120 following the removal of fin spacers 156f and the formation of S/D openings 180. FIG. 12B is a cross-sectional view, along cut line B-B of FIG. 12A, showing no tin spacers 156f FIG. 12C is a cross-sectional view along cut line C-C of FIG. 12A, showing sacrificial structures 108p of two adjacent FETs 120a and 120c and S/D openings 180 on fin top spacers 123.

The S/D recess operation benefits from the presence of fin top spacers 123, which serve as etch stop layers, preventing erosion of fins 105. Without fin top spacers 123, local pattern density variation could influence the amount of fin erosion that may occur during the S/D recess etch process, causing an uneven starting level for subsequent growth of SiGe epitaxial S/D regions 170. With fin top spacers in place, S/D openings 180 are substantially uniform, allowing for substantially uniform epitaxial S/D growth at subsequent operations.

Figure 13B:
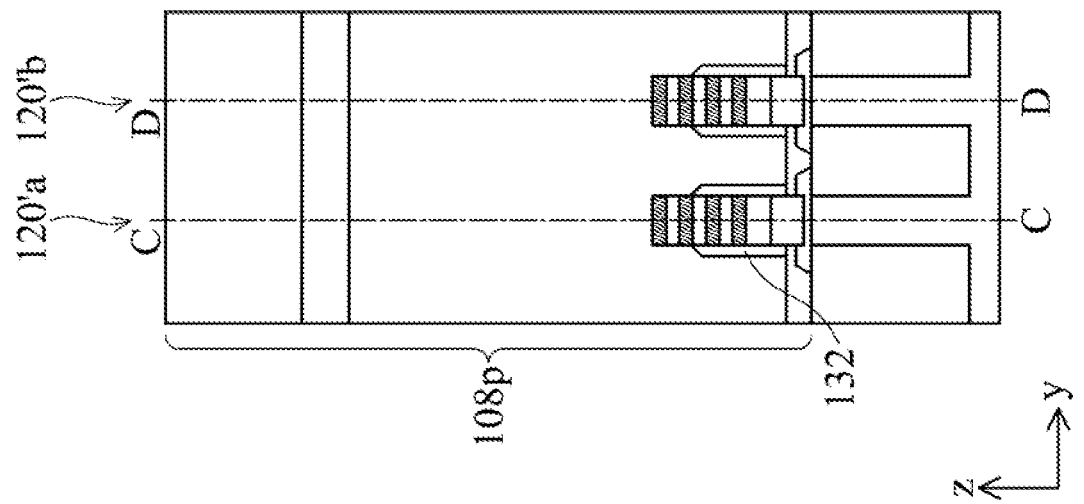
Figure 13A:
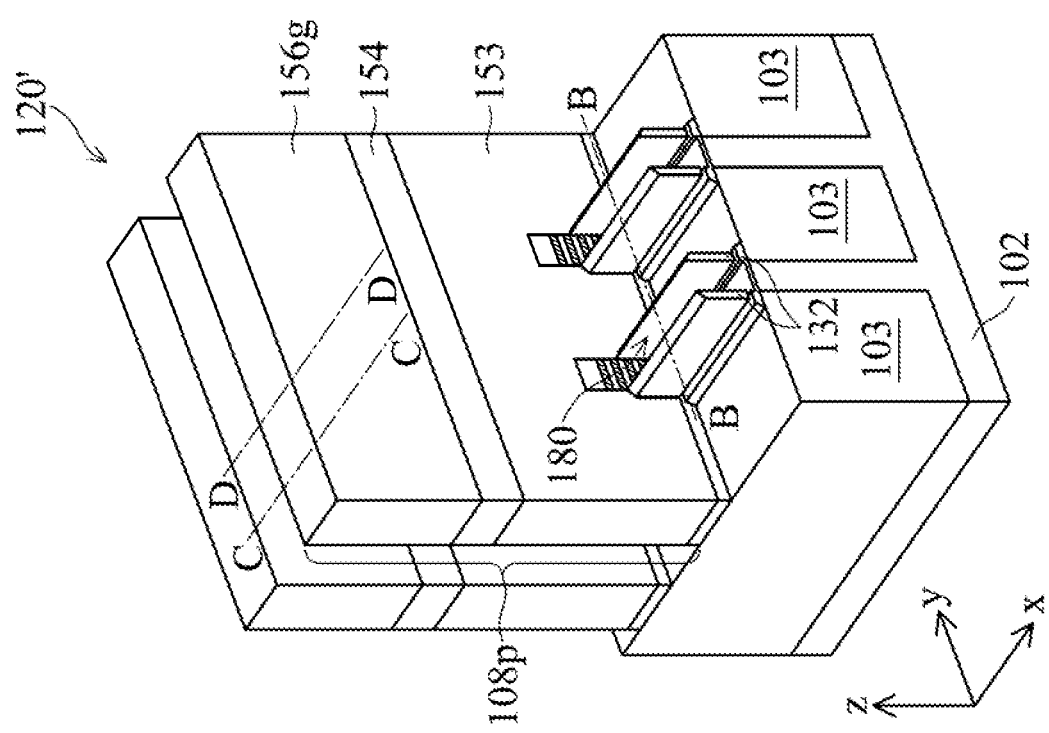
Figure 13C:
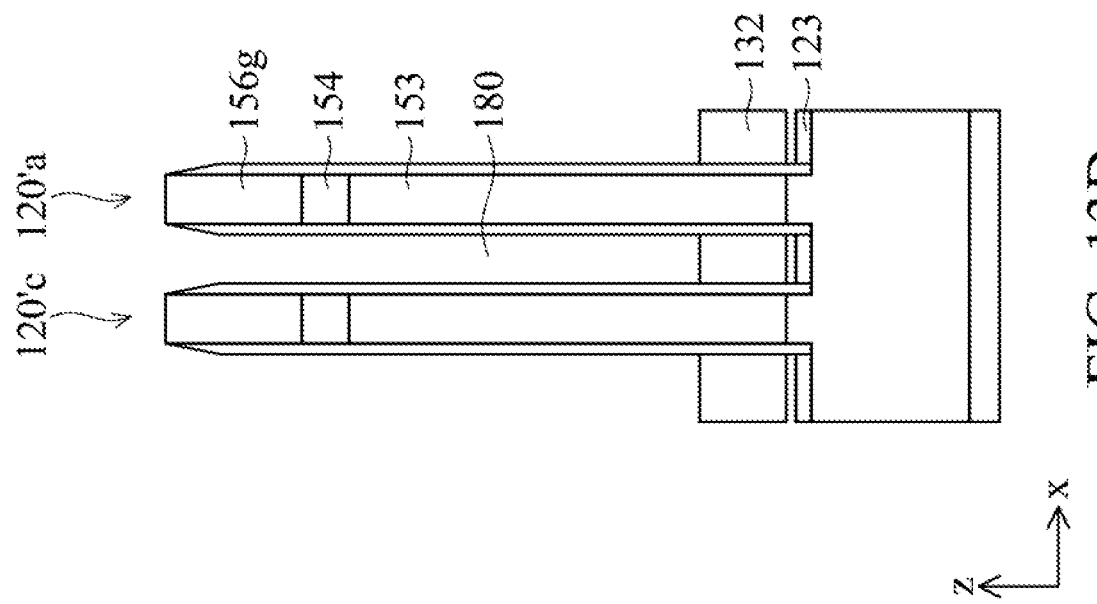
Figure 13D:
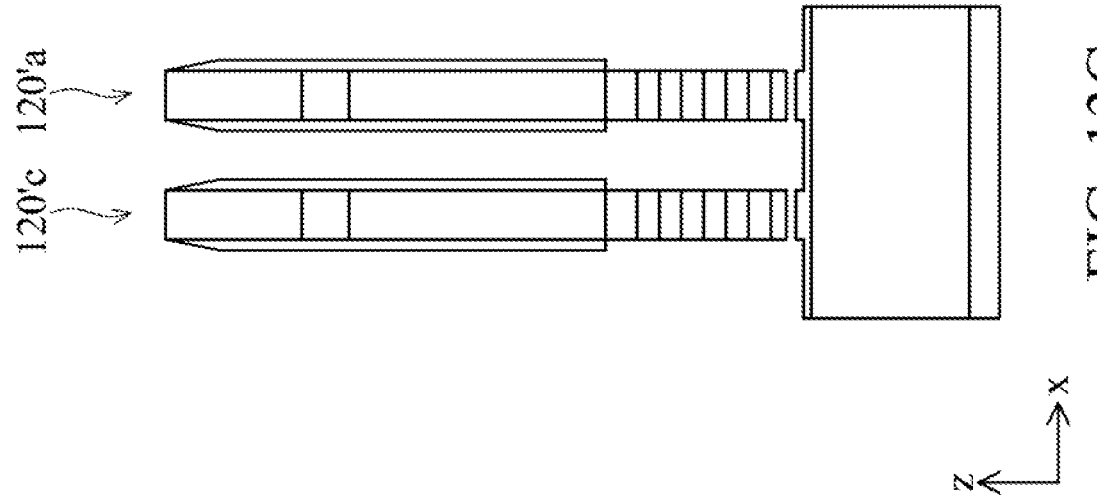

In some embodiments, unlike the structures of FIGS. 12A-12C, fin spacers 156f are removed from top surfaces of superlattice structures 155 and not removed from sidewalls of superlattice structures 155 before removing superlattice structures 155. As a result, sidewall spacers 132 remain, as shown in FIGS. 13A-13C. FIG. 13A is an isometric view of GAAFET 120' following the formation of sidewall spacers 132 and the formation of S/D openings 180. FIG. 13B is a cross-sectional view along cut line B-B of FIG. 13A, showing the height of sidewall spacers 132 relative to the height of the portions of superlattice structures 155 underlying polysilicon layer 153. In some embodiments, the height of sidewall spacers 132 can be about 40% to about 50% of the height of superlattice structures 155. FIG. 13C is a cross-sectional view along cut lines C-C of FIGS. 13A and 13B. FIG. 13C shows sacrificial structures 108p of two adjacent FETs 120'a and 120'c. FIG. 13D is a cross-sectional view along cut lines D-D of FIGS. 13A and 13B. The cut line D-D intersects sidewall spacers 132, and thus sidewall spacers 132 are shown in FIG. 13D.

Figure 16:
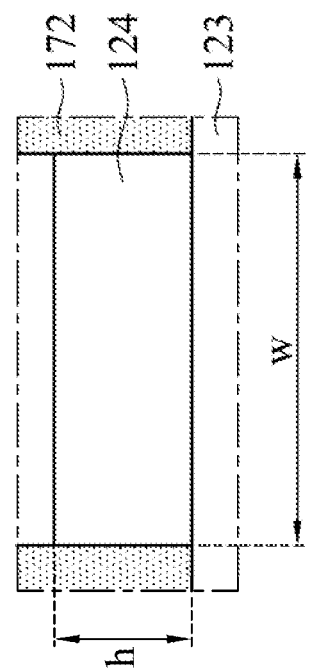

Following the formation of S/D openings 180, lateral access to the portions of superlattice structures 155 underlying polysilicon layer 153 permits subsequent removal of portions of the nanostructured layer 122 and formation of inner spacers 164 shown in FIG. 16.

Figure 14B:
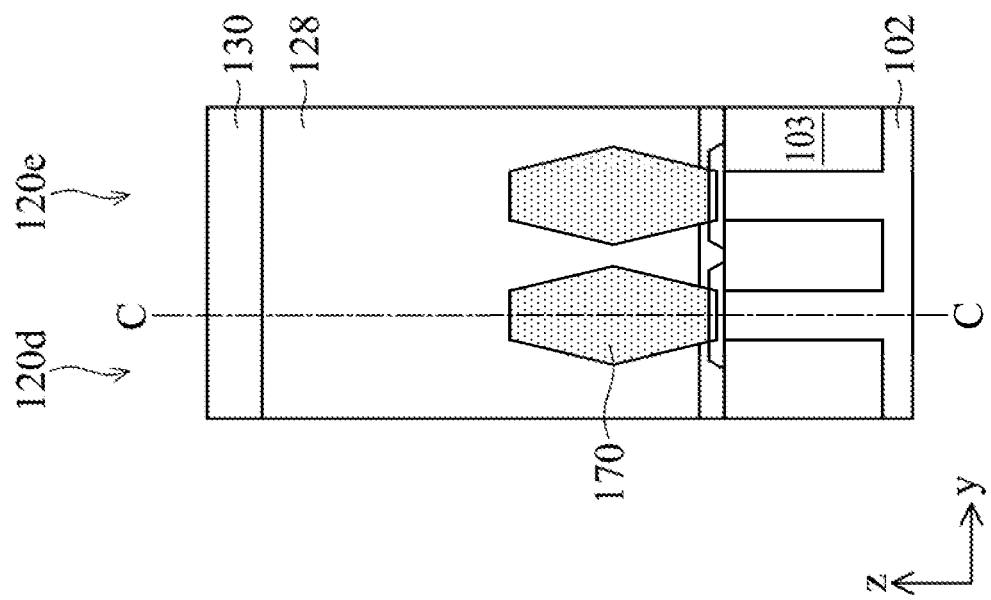
Figure 14A:
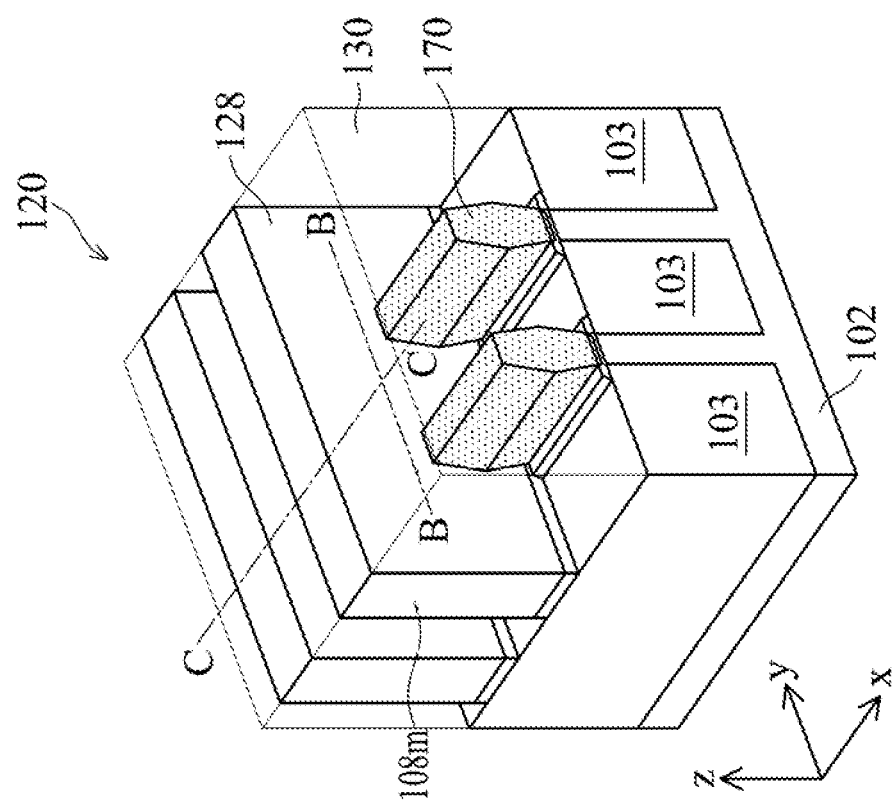
Figure 14C:
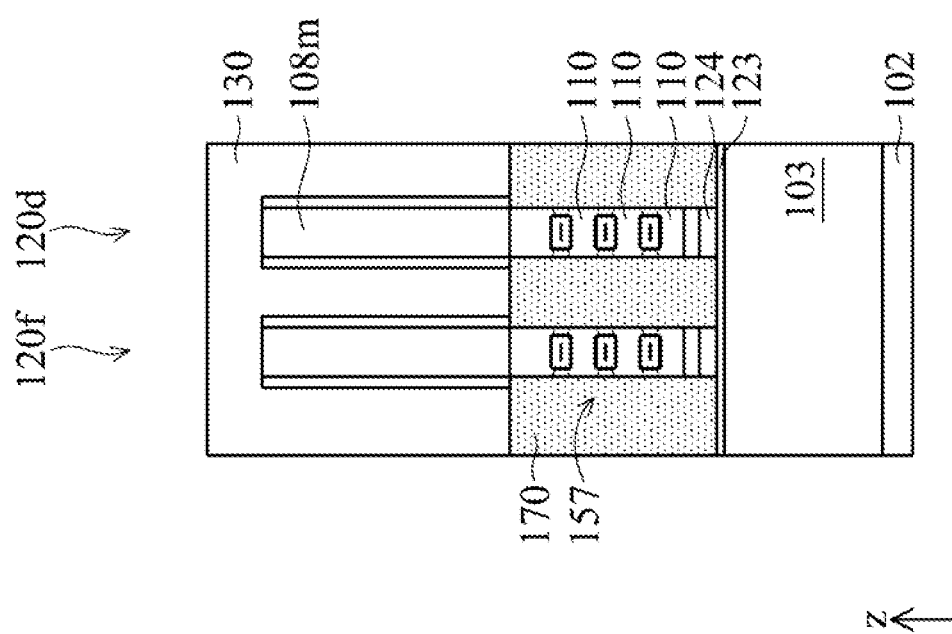

Referring to FIG. 5, in operation 216, epitaxial S/D regions are formed within the S/D openings and GAA structures is formed. For example, as shown in FIGS. 14A-14C, epitaxial SID regions 170 are formed within S/D openings 180 shown in FIGS. 12A and 12C. Epitaxial S/D regions 170 are grown from nanostructured layers 121 and/or 122 of superlattice structures 155 under polysilicon layer 153. Because fin spacers 156f were removed, growth of epitaxial S/D regions 170 laterally outward from nanostructured layers 121 and/or 122 is substantially unconstrained, producing elongated hexagonal-shaped epitaxial S/D regions 170, as shown in FIGS. 14A and 14B. Representations of epitaxial S/D regions 170 in FIGS. 14A and 14B are not drawn to scale. Following the formation of epitaxial S/D regions 170, sacrificial structure 108p is removed and replaced with a metal gate structure 108m, as described below in further detail. FIG. 14B is a cross-sectional view along cut line B-B of FIG. 14A. FIG. 14C is a cross-sectional view along cut line C-C of FIG. 14A, across metal gate structure 108m, and through epitaxial S/D regions 170. Consequently, FIG. 14C shows sidewalls of epitaxial S/D regions 170, as well as GAA channel region 157 between epitaxial S/D regions 170.

Figure 15B:
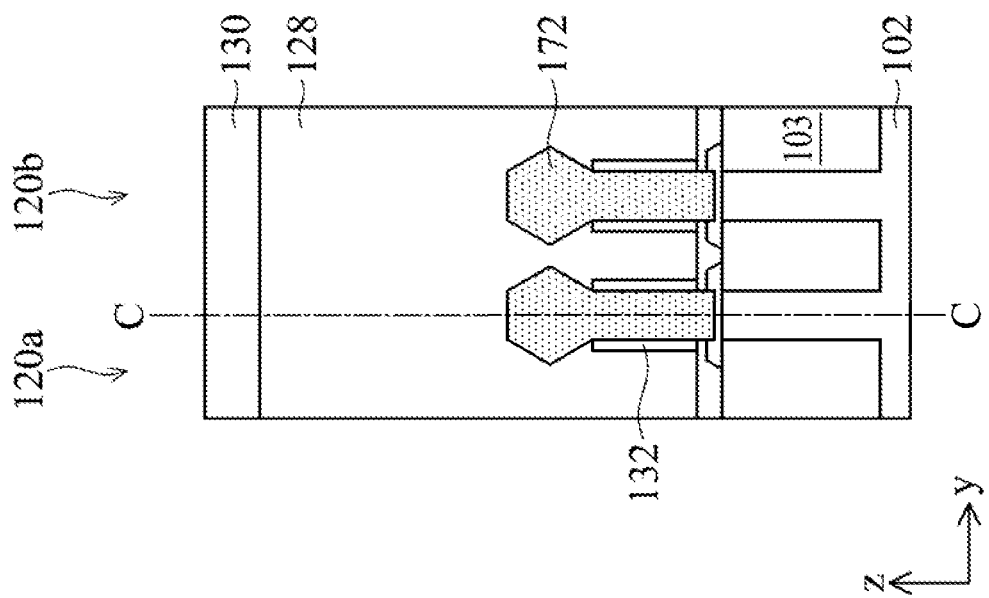
Figure 15A:
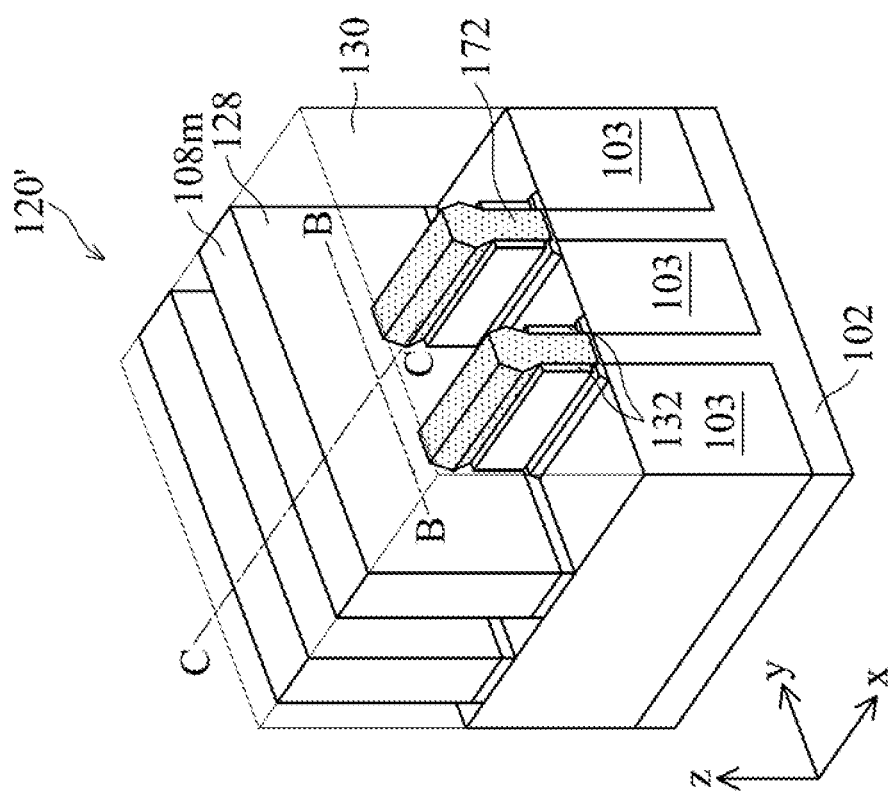
Figure 15C:
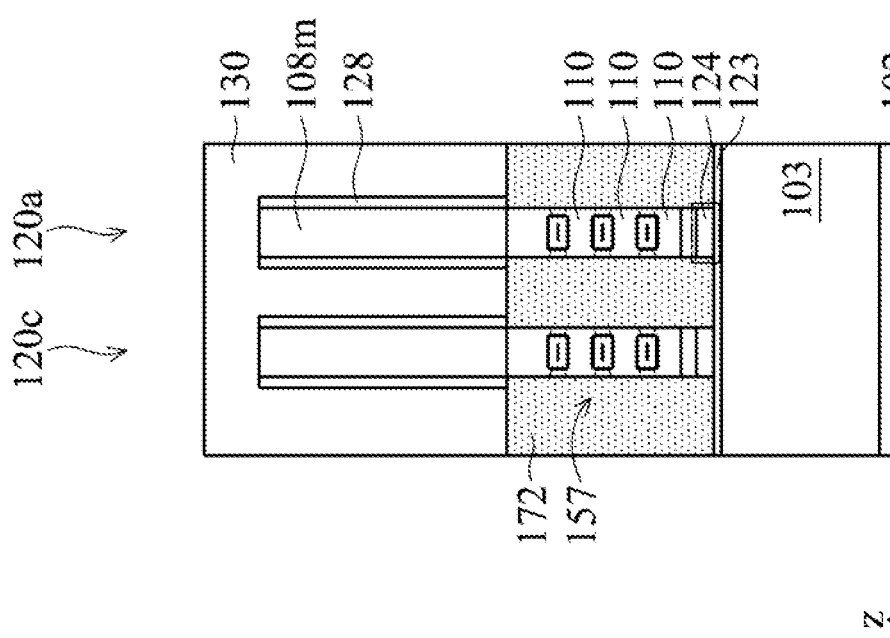

In some embodiments, epitaxial S/D regions 172 are formed within SID openings 180 shown in FIGS. 13A and 13C. Epitaxial S/D regions 172 are grown from nanostructured layers 121 and/or 122 of superlattice structures 155 under sacrificial structure 108p. Because of the presence of sidewall spacers 132, epitaxial growth of S/D regions 172 laterally outward from nanostructured layers 121 and/or 122 is constrained. As a result, S/D regions 172 can have upper hexagonal-shaped cross-sections, and lower rectangular-shaped cross-sections as shown in FIGS. 15A and 15B. FIG. 15B is a cross-sectional view along cut line B-B of FIG. 15A. FIG. 15C is a cross-sectional view along cut line C-C of FIG. 15A, across metal gate structure 108m, and through S/D regions 172. Consequently, FIG. 15C shows sidewalls of S/D regions 172, as well as GAA channel region 157 between S/D regions 172.

Following the formation of epitaxial S/D regions 170 or 172, ILD layer 130 is formed, as shown in FIGS. 14A-14C and FIGS. 15A-15C. Following the formation of ILD layer 130, hard masks 154 and 156g are removed, sacrificial structure 108p is removed, and nanostructured layers 122 are selectively removed to form gate openings in GAA channel region 157 (not shown). The gate openings are filled with metal by depositing gate structure 108m, to form GAA channel region 157 shown in FIGS. 14C and 15C. The remaining nanostructured layers 121 of superlattice structures 155 form nanostructured channels 110 of GAAFETs 120 or 120'. Each of GAA channel regions 157 can include GAA structures 158 (three shown), which are formed within the gate openings formed by removing nanostructured layers 122.

FIG. 16 is a magnified view of FIG. 15C, showing dimensions of air gaps 124 relative to surrounding structures.

Figure 17B:
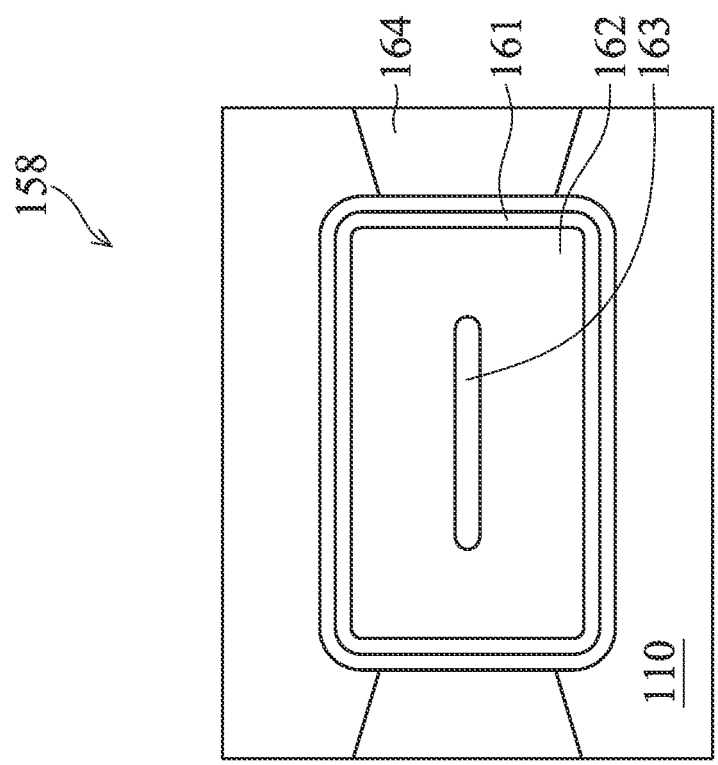
Figure 17A:
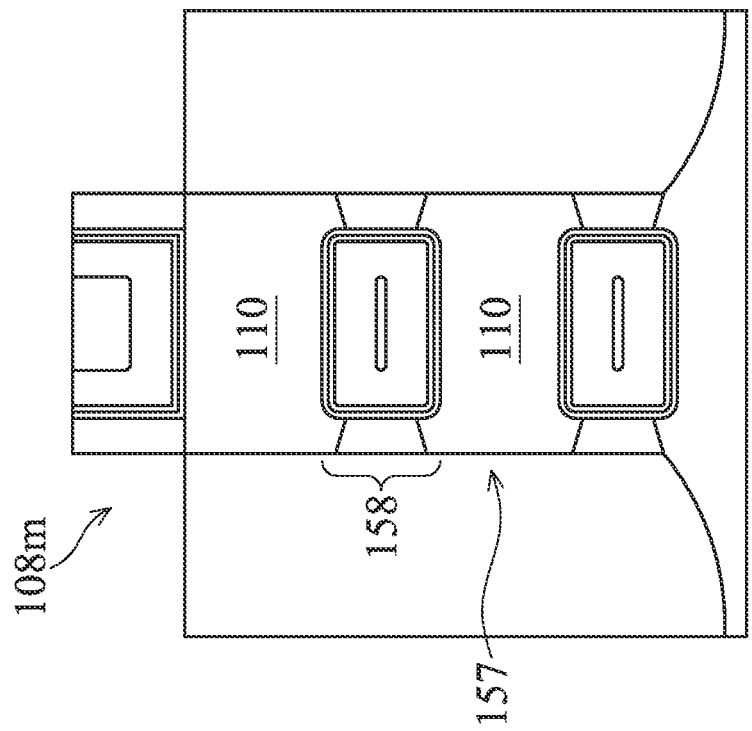

FIGS. 17A-17B are magnified views, illustrating, in more detail metal gate structure 108m with GAA channel region 157, which includes GAA structures 158 shown in FIGS. 14C and 15C, according to some embodiments. GAA structure 158 can be viewed as a radial gate stack that includes, from the outermost layer to the innermost layer, a gate dielectric layer 161, a work function metal layer 162, and a gate electrode 163. Gate electrode 163 is operable to maintain a capacitive applied voltage across nanostructured channels 110. Gate dielectric layer 161 separates the metallic layers of GAA structure 158 from nanostructured channels 110. Inner spacers 164 electrically isolate GAA structure 158 from epitaxial S/D regions 170 or 172 and prevent current from leaking out of nanostructured channels 110.

Gate dielectric layer 161 can have a thickness in a range from less than 1 nm to about 5 nm. Gate dielectric layer 161 can include a silicon oxide and may be formed by CVD, atomic layer deposition (ALD), physical vapor deposition (PVD), e-beam evaporation, or another suitable deposition process. In some embodiments, the dielectric layer can include (i) a layer of silicon oxide, silicon nitride, and/or silicon oxynitride, (ii) a high-k dielectric material, such as aluminum oxide (Al2O3), hafnium oxide (HfO2), hafnium aluminum oxide (HfAlOx), titanium oxide (TiO2), hafnium zirconium oxide (HarOx), tantalum oxide (Ta2O3), hafnium silicate (HfSiO4), hafnium silicon oxide (HfSiOx), zirconium oxide (ZrO2), zirconium silicate (ZrSiO2), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. A high-k gate dielectric may be formed by ALD and/or other deposition methods. In some embodiments, the gate dielectric layer can include a single layer or multiple insulating material layers.

Gate work function metal layer 162 can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process, such as ALD, CVD, PVD, plating, or combinations thereof. In some embodiments, the gate work function metal layer can have a thickness in a range from about 2 nm to about 15 nm. Other materials, formation methods, and thicknesses for the gate work function metal layer are within the scope and spirit of this disclosure.

Gate electrode 163 may further include a gate metal fill layer. The gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, other materials and formation methods for the gate metal fill layer are within the scope and spirit of this disclosure.

Gate-all-around transistors (GAAFETs) and FinFETs are disclosed in which epitaxial source/drain regions (170, 172) and nanostructured channels 110 are fully isolated from substrate 102 by air gaps 124, to prevent current leakage. Such a transistor design is known as a substrate-isolated device, or a "fin-on-nothing" (FON) approach. In some embodiments, the substrate-isolated device also features a self-aligned fin top spacer 123, which is formed below the air gap 124. The fin top spacer 123 can be used as an etch stop layer to produce substantially uniform fin heights from one FET to another.

In some embodiments, a method includes forming a fin with a sacrificial layer on a semiconductor substrate, forming isolation regions on the semiconductor substrate and adjacent to the fin, forming a superlattice structure with first and second nanostructured layers on the sacrificial layer, forming a sacrificial structure that surrounds the superlattice structure, forming a first spacer on the superlattice structure, forming an air gap between the superlattice structure and the fin, and forming a second spacer on the fin and below the superlattice structure.

In some embodiments, a method includes forming a fin with a sacrificial layer on a substrate, forming isolation regions on the substrate and adjacent to the fin, forming a stack of first and second nanostructured layers on the sacrificial layer, forming a polysilicon structure surrounding the stack of first and second nanostructured layers, the polysilicon structure defining a gate length, forming a first spacer surrounding the stack of first and second nanostructured layers, forming an air gap between the fin and the stack of first and second nanostructured layers, replacing portions of the stack of first and second nanostructured layers not covered by the polysilicon structure with epitaxial source/drain regions, and replacing the polysilicon structure with a gate structure.

In some embodiments, a semiconductor device includes a substrate, a fin having a top surface, a spacer disposed on the top surface, first and second epitaxial source/drain (S/D) regions suspended above the fins, a stack of nanostructured layers suspended above the spacer and disposed between the first and second epitaxial S/D regions, an air gap disposed between the stack of nanostructured layers and the spacer and between the epitaxial S/D regions and the spacer, and a gate structure surrounding the nanostructured layers.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin with a sacrificial layer on a semiconductor substrate;
   forming isolation regions on the semiconductor substrate and adjacent to the fin;
   forming a superlattice structure with first and second nanostructured layers on the sacrificial layer;
   forming a sacrificial structure that surrounds the superlattice structure;
   forming a first spacer on the superlattice structure and the isolation regions;
   forming an air gap between the superlattice structure and the fin after forming the first spacer; and
   forming a second spacer on the fin and below the superlattice structure.

2. The method of claim 1, wherein forming the air gap comprises etching top surfaces of the isolation regions.

3. The method of claim 1, wherein forming the air gap comprises etching the sacrificial layer.

4. The method of claim 1, wherein forming the air gap comprises etching portions of the isolation regions adjacent to the sacrificial layer.

5. The method of claim 1, wherein forming the air gap comprises etching portions of the isolation regions to expose sidewalls of the portions of the sacrificial layer that are not under the sacrificial structure.

6. The method of claim 1, further comprising growing source/drain regions from the first or second nanostructured layers.

7. The method of claim 1, wherein forming the first spacer on the superlattice structure comprises forming the first spacer on portions of the superlattice structure that are not covered by the sacrificial structure.

8. The method of claim 1, further comprising:
   removing a portion of the first spacer; and
   growing source/drain regions from the first or second nanostructured layers.

9. The method of claim 1, wherein forming the second spacer comprises depositing a dielectric layer on the isolation regions.

10. The method of claim 1, wherein forming the second spacer comprises depositing a dielectric layer within the air gap and on the fin.

11. A method, comprising:
    forming a fin with a sacrificial layer on a substrate;
    forming isolation regions on the substrate and adjacent to the fin;
    forming a stack of first and second nanostructured layers on the sacrificial layer;
    forming a polysilicon structure surrounding the stack of first and second nanostructured layers, the polysilicon structure defining a gate length;
    forming a first spacer surrounding the stack of first and second nanostructured layers;
    forming an air gap between the fin and the stack of first and second nanostructured layers after forming the first spacer;
    replacing portions of the stack of first and second nanostructured layers not covered by the polysilicon structure with epitaxial source/drain regions; and
    replacing the polysilicon structure with a gate structure.

12. The method of claim 11, wherein forming the air gap comprises etching portions of the isolation regions adjacent to the sacrificial layer.

13. The method of claim 11, further comprising etching the second nanostructured layers.

14. The method of claim 11, further comprising forming an etch stop layer within the air gap.

15. The method of claim 11, wherein forming the air gap comprises forming the air gap with a height in a range of about 1 nm to about 30 nm.

16. The method of claim 15, wherein forming the air gap comprises forming the air gap with a width substantially equal to the gate length, a height that ranges from about 1 nm to about 30 nm, and an aspect ratio that ranges from about 0.2:1 to about 1:1.

17. A method, comprising:
    forming a fin on a substrate;
    epitaxially growing a semiconductor layer on a top surface of the fin;
    epitaxially growing nanostructured layers on the semiconductor layer;
    forming a first spacer directly on sidewalls of the nanostructured layers;

removing the semiconductor layer to expose the top surface of the fin while the sidewalls of the nanostructured layers are covered by the first spacer;

forming a second spacer on the exposed top surface of the fin;

forming a source/drain (S/D) region suspended on the fin; and forming a gate structure surrounding the nanostructured layers.

18. The method of claim 17, further comprising etching the first spacer to form sidewall spacers adjacent to the S/D region.

19. The method of claim 18, wherein etching the first spacer comprises etching a top portion of the first spacer to form the sidewall spacers.

20. The method of claim 17, further comprising forming a third spacer disposed on a bottom surface of the nanostructured layers.

* * * * *